US012297101B2

(12) United States Patent
Chung et al.

(10) Patent No.: US 12,297,101 B2
(45) Date of Patent: May 13, 2025

(54) STRETCHABLE SUBSTRATE AND METHOD OF MANUFACTURING THE SAME

(71) Applicant: Korea Institute of Science and Technology, Seoul (KR)

(72) Inventors: Seungjun Chung, Seoul (KR); Phillip Lee, Seoul (KR); Jeong Gon Son, Seoul (KR); Heesuk Kim, Seoul (KR); Jai Kyeong Kim, Seoul (KR); Seunghyun Lee, Seoul (KR); Byeongmoon Lee, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 729 days.

(21) Appl. No.: 17/343,667

(22) Filed: Jun. 9, 2021

(65) Prior Publication Data

US 2022/0162060 A1 May 26, 2022

(30) Foreign Application Priority Data

Nov. 25, 2020 (KR) .......................... 10-2020-0160346

(51) Int. Cl.
*B81C 1/00* (2006.01)
*B29C 35/02* (2006.01)
*G06F 1/16* (2006.01)

(52) U.S. Cl.
CPC .......... *B81C 1/00134* (2013.01); *B29C 35/02* (2013.01); *B81C 1/00555* (2013.01); *B81C 2201/0101* (2013.01); *G06F 1/163* (2013.01); *G06F 1/1652* (2013.01)

(58) Field of Classification Search
CPC ...... B81C 1/00555; B33Y 10/00; B29C 64/10
See application file for complete search history.

(56) References Cited

U.S. PATENT DOCUMENTS

| | | | |
|---|---|---|---|
| 6,830,643 B1 * | 12/2004 | Hayes | B33Y 10/00 |
| | | | 156/289 |
| 2017/0215284 A1 * | 7/2017 | Ng | B33Y 80/00 |
| 2019/0248089 A1 * | 8/2019 | Busbee | A41C 5/00 |
| 2020/0151290 A1 * | 5/2020 | Konakovic-Lukovic | ..... |
| | | | G06F 30/17 |

FOREIGN PATENT DOCUMENTS

| | | |
|---|---|---|
| KR | 10-1749861 B1 | 6/2017 |
| KR | 10-2018-0061003 A | 6/2018 |

OTHER PUBLICATIONS

Kelkar, Parth Uday et al.; "Cellular Auxetic Structures for Mechanical Metamaterials: A Review"; Sensors; Jun. 1, 2020; pp. 1-26; 20, 3132; doi.org/10.3390/s20113132.

* cited by examiner

*Primary Examiner* — Scott W Dodds
(74) *Attorney, Agent, or Firm* — Studebaker Brackett PLLC

(57) ABSTRACT

Provided is a method of manufacturing a stretchable substrate according to various embodiments of the present disclosure in order to implement the above-described objects. The method may include forming an auxetic including a plurality of unit structures and forming one or more microstructures.

5 Claims, 15 Drawing Sheets

STRETCHABLE SUBSTRATE AND METHOD OF MANUFACTURING THE SAME

CROSS-REFERENCE TO RELATED APPLICATION

This application claims priority to and the benefit of Korean Patent Application No. 10-2020-0160346, filed on Nov. 25, 2020, the disclosure of which is incorporated herein by reference in its entirety.

BACKGROUND

1. Field of the Invention

The present disclosure relates to a stretchable substrate material, and more particularly, to a stretchable substrate, in which an elastic substrate is formed to include a mechanical metamaterial with a negative Poisson's ratio and of which, when stretched in one axial direction, a strain in another axial direction is controllable, and a method of manufacturing the same.

2. Discussion of Related Art

In recent years, beyond conductive elements in which electrodes are formed on a rigid substrate, research and development has been actively conducted on stretchable electronic elements in which electrodes are formed on a flexible substrate. Stretchable electronic elements are electronic elements that are manufactured on a substrate stretchable freely in response to external stress and are next-generation electronic elements that maintain the electrical/physical properties of an element even when mechanical deformation occurs or external force is applied. Such stretchable electronic elements may be applied to flexible devices, wearable devices, or the like and, furthermore, may be used as displays or sensors or electrodes attached to the human body.

Stretchable electronic elements may be most widely used in fields such as stretchable displays, stretchable solar cells, and stretchable energy storage/power generation devices. The stretchable electronic elements are showing potential as a next-generation technology that follows flexible displays. In addition, the stretchable electronic elements not only increase a degree of freedom in design due to excellent mechanical variability thereof but also secure mechanical stability against an external force, thereby expanding to markets such as wearable devices, electronic skin, smartphones, medical devices, healthcare monitoring systems, defense industries, and aerospace industries.

For a specific example, a display field is developed in a direction in which a degree of freedom of deformation is increased from a fixed flat/curved display to a flexible, foldable, or rollable display that is foldable or rollable in a single direction. Recently, as electronic devices have become smart and spatial mobility thereof is emphasized, there is a need to develop a stretchable display that is deformable in a multidimensional axis direction under various conditions and freely usable beyond a fixed display.

As described above, it is expected that, with the advancement of technology related to a stretchable display field, the implementation of a new digital interface beyond the existing method will be possible. However, since a stretchable display does not have a fixed axis or direction of deformation, unlike conventional flexible, foldable, and rollable displays, distortion is emerging as an issue during deformation.

Accordingly, there may be a need to develop a technology for a substrate that is freely deformable without distortion of a display, even under low stress, and develop a technology for a stretchable electrode having low resistance, high flexibility, and high stability. That is, in the art, there may be a demand for a stretchable substrate which has stable mechanical strain, reduces distortion, and has high transmittance.

RELATED ART DOCUMENTS

Patent Document

Korean Registered Patent Publication No. 10-1749861 (Jun. 15, 2017)

SUMMARY OF THE INVENTION

The present disclosure is directed to providing a stretchable substrate, in which an elastic substrate is formed to include a mechanical metamaterial with a negative Poisson's ratio and of which, when stretched in one axial direction, a strain in another axial direction is controllable, and a method of manufacturing the same.

The technical objects of the present disclosure are not limited to the above-described ones, and the other undescribed technical objects will become apparent to those skilled in the art from the following description.

According to an aspect of the present disclosure, there is provided a method of manufacturing a stretchable substrate, the method including forming an auxetic including a plurality of unit structures and forming one or more microstructures.

The one or more microstructures may include one or more first microstructures formed to protrude from one surface so as to correspond to a shape and an area of each of the plurality of unit structures.

The forming of the one or more microstructures may include forming the one or more first microstructures on a fixing surface, forming a substrate part made of an elastic material, and separating the fixing surface.

The forming of the one or more microstructures may further include treating the fixing surface with a release preventing agent, and the release preventing agent may be applied, printed, or sprayed.

The forming of the auxetic may include forming the auxetic on the substrate part including the one or more first microstructures and forming a fixing part.

The forming of the one or more microstructures may include forming a substrate part made of an elastic material and forming the one or more first microstructures on the substrate part, and the forming of the auxetic may include forming the auxetic on the substrate part on which the one or more first microstructures are formed, and forming a fixing part.

The forming of the auxetic may include forming a substrate part and forming the auxetic on the substrate part, and the forming of the one or more microstructures may include forming a fixing part on the substrate part on which the auxetic is formed and forming the one or more first microstructures on the substrate part.

The one or more microstructures may include one or more second microstructures each provided in contact with one end surface inside each of the plurality of unit structures.

The forming of the auxetic may include forming a substrate part and forming the auxetic on the substrate part, and the forming of the auxetic on the substrate part may include printing the auxetic including the one or more second microstructures.

The forming of the auxetic may further include forming the auxetic including a porous pattern, and the porous pattern may be formed to include one or more holes including an inner space layer.

According to another aspect of the present disclosure, there is provided a stretchable substrate including an auxetic including a plurality of unit structures and having a negative Poisson's ratio, one or more microstructures provided in each of the unit structures, and a fixing part configured to fix the auxetic.

The one or more microstructures may include at least one of one or more first microstructures formed to protrude from one surface so as to correspond to a shape and an area of each of the plurality of unit structures and one or more second microstructures each provided in contact with one end surface inside each of the plurality of unit structures.

At least a portion of the one or more first microstructures may have a hemispherical shape.

The one end surface inside each of the plurality of unit structures, on which each of the one or more second microstructures is provided, may be one end surface that does not inhibit mechanical deformation for implementing the negative Poisson's ratio.

The stretchable substrate may further include a substrate part configured to fix the one or more microstructures and configured to couple and fix a portion of the auxetic and the one or more microstructures through curing.

The stretchable substrate may further include a fixing surface configured to temporarily support the one or more microstructures.

Other concrete matters of the present disclosure are included in the detailed description and drawings of the specification.

BRIEF DESCRIPTION OF THE DRAWINGS

Now, various aspects will be described with reference to the accompanying drawings and like reference numerals collectively designate like elements. In the following embodiments, for the purpose of description, various specific details are suggested to provide overall understanding of one or more aspects. However, it is obvious that the aspects may be embodied without the specific details.

DETAILED DESCRIPTION OF EXEMPLARY EMBODIMENTS

Figure 1:
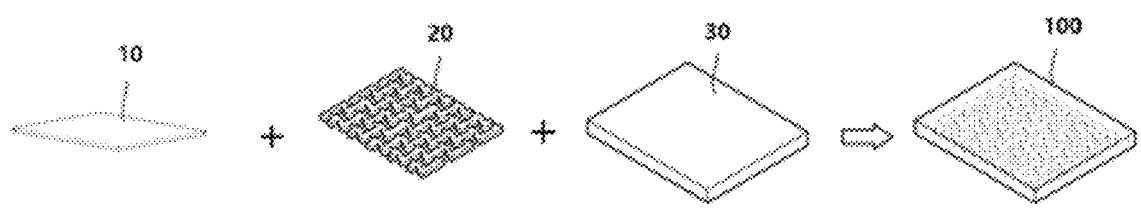
FIG. 1 shows schematic diagrams illustrating a stretchable substrate according to one embodiment of the present disclosure.

Various embodiments and/or aspects will be disclosed with reference to the accompanying drawings. In the following description, for the purpose of description, various specific details are disclosed to provide overall understanding of one or more aspects. However, those skilled in the art may understand that the aspect(s) may be embodied without having the specific details. The following description and accompanying drawings thoroughly describe specific exemplary aspects of one or more aspects. However, the aspects are provided for an illustrative purpose, some of various methods in principles of the various aspects may be used, and the descriptions are intended to include all of the aspects and equivalents thereof. Specifically, the "embodiment," "example," "aspect," "illustration," and the like used in the present specification may not be interpreted as a described arbitrary aspect or design being better than or more advantageous than other aspects or designs.

Hereinafter, in the drawings, the same or similar elements are denoted by the same reference numerals even though they are depicted in different drawings, and a detailed description of the same or similar elements will be omitted. In addition, in the following description of the embodiments disclosed herein, a detailed description of related arts will be omitted when it is determined that the gist of the embodiments disclosed herein may be obscured. Also, the accompanying drawings are used to help easily understand the embodiments disclosed herein, and it should be understood that the technical idea disclosed herein are not limited by the accompanying drawings.

It will be understood that, although the terms first, second, etc. may be used herein to describe various elements or components, these elements or components should not be limited by these terms. These terms are only used to distinguish one element or component from another element or component. Thus, a first element or component discussed below could be termed a second element or component without departing from the technical idea of the present disclosure.

Unless otherwise defined, all terms (including technical and scientific terms) used in the present specification may be used as the same meaning which may be commonly understood by the person with ordinary skill in the art to which the present disclosure belongs. It will be further understood that terms defined in commonly used dictionaries should not be interpreted in an idealized or excessive sense unless expressly and specifically defined.

Further, the term "or" is intended to mean not exclusive "or" but implicational "or." That is, when it is not specifically designated or unclear in the context, "X uses A or B" is intended to refer to one of natural implicational substitutions. In other words, "X uses A or B" may be applied to any case of "X uses A," "X uses B," or "X uses both A and B." Further, it should be understood that the term "and/or" used in the present specification indicates and includes all possible combinations of one or more items among related listed items.

It should be understood that the term "comprise" and/or "comprising" means existence of the corresponding feature and/or element but does not exclude the existence or addition of one or more other features, elements, and a group thereof. In addition, when not separately defined or not clear in terms of the context that a singular form is indicated, it should be construed that the singular form generally means "one or more" in the present specification and the claims.

It will be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

In addition, a suffix "module," "unit," or "portion" of an element used herein is assigned or incorporated for convenience of specification description, and the suffix itself does not have a distinguished meaning or function.

It will be understood that when an element or layer is referred to as being "on" or "above" another element or layer, the element or layer can be directly on or above another element or layer or intervening elements or layers may be present. In contrast, when an element is referred to as being "directly on" or "directly above," there are no intervening elements or layers.

Spatially relative terms, such as "below," "beneath," "lower," "above," "upper," and the like, may be used herein for ease of description to describe one element or feature's relationship to another element(s) or feature(s) as illustrated in the drawings. It will be understood that the spatially relative terms are intended to encompass different orientations of the device in use or in operation, in addition to the orientation depicted in the figures.

For example, when the device in the figures is turned over, elements described as "below" or "beneath" or "under" other elements or features would then be oriented "above" the other elements or features. Thus, the exemplary term "below" can encompass both an orientation of above and below. Since an element may be oriented in another direction, the spatially-relative terms may be interpreted in accordance with the orientation of the element.

The objects and effects of the present disclosure and technical solutions for accomplishing these may be apparent with reference to embodiments to be described below in detail along with the accompanying drawings. In the description of the present disclosure, detailed descriptions of known functions or configurations will be omitted lest they should obscure the subject matter of the present disclosure. The terms as set forth herein are defined in consideration of the functions of the present disclosure and may vary according to customs or the intent of a user and an operator.

However, the present disclosure is not limited to the embodiments set forth below and may be embodied in various other forms. The present embodiments may be provided to make the present disclosure complete and to enable the person skilled in the art to fully understand the category of the present disclosure. The present disclosure may be defined only by the category described in the appended claims. Thus, the definition may be made based on the entirety of the description of the present specification.

FIG. 1 shows schematic diagrams illustrating a stretchable substrate 100 according to one embodiment of the present disclosure. The stretchable substrate 100 may have a negative Poisson's ratio and may include an auxetic 20 formed through a plurality of unit structures. The auxetic 20 may refer to a mechanical metamaterial having a mechanism for exhibiting a new mechanical function, which did not previously exist, through a plurality of unit structures. For example, the auxetic 20 related to the mechanical metamaterial may have a structure that expands in a vertical direction unlike typical stretching in nature.

Specifically, the auxetic 20 included in the stretchable substrate 100 may include the plurality of unit structures. In this case, since each unit structure is provided through one or more shapes, the auxetic 20 may have a negative Poisson's ratio. A Poisson's ratio may refer to a ratio of transverse strain to longitudinal strain when a tensile force is applied to a material to stretch the material in a specific direction. In other words, the Poisson's ratio may refer to a strain of a transverse direction versus a longitudinal direction.

Most of materials have a positive Poisson's ratio because a strain in a stretching direction and a strain in a lateral direction of a material have different signs when a tensile force is applied in a single axis. However, when a material is designed to form a specific lattice structure, a negative Poisson's ratio can be realized macroscopically even when a structural material has a positive Poisson's ratio.

For a specific example, in a material having a general non-auxetic structure, when stress is applied in a transverse direction, the material expands in the transverse direction and contracts in a longitudinal direction at the same time. That is, a Poisson's ratio between longitudinal deformation and transverse deformation to a vertical stress generated inside the material may be positive.

On the other hand, in a material having an auxetic structure, when stress is applied in a transverse direction, the material may expand in both transverse and longitudinal directions. That is, a Poisson's ratio due to a vertical stress generated inside the material may be negative.

According to one embodiment of the present disclosure, the auxetic 20 for forming the stretchable substrate 100 may be formed through a printing process using an elastic material. According to one embodiment, the auxetic 20 may be formed by performing a process of forming a substrate part 10 and performing a printing process on one surface of the formed substrate part 10. The substrate part 10 may be provided to support the auxetic 20 in a process of forming the auxetic, may be provided in a shape of a thin film, and may constitute a portion of the stretchable substrate 100 after the printing process. That is, a plurality of unit structures having a specific shape may be formed (stacked) on an upper portion of the substrate part 10 using the substrate part 10 as a support through a printing process using an elastic material, thereby forming the auxetic 20.

In addition, according to another embodiment, a printing process may be performed on one surface of a fixing surface 40, and after curing, the fixing surface is separated, thereby forming the auxetic 20 of the present disclosure. The fixing surface 40 may be provided to temporarily support the auxetic 20 in a process of forming the auxetic 20 and may be separated from the auxetic 20 after the printing process. That is, the auxetic 20 may be formed by performing a printing process using the separate fixing surface 40 different from components constituting the stretchable substrate 100, and the auxetic 20 of the present disclosure may be formed through a process of separating the formed auxetic 20 from the fixing surface 40.

In other words, the process of forming the auxetic 20 in the present disclosure may include at least one of a process of performing a printing process on the substrate part 10 made of a thin elastic body (that is, a process in which the substrate part used as a support is included in the stretchable substrate) and a process of forming the auxetic 20 using the flat fixing surface 40 and separating the fixing surface 40 after curing to form the auxetic (that is, a process of separating a separate support to prepare only the auxetic).

Figure 2:
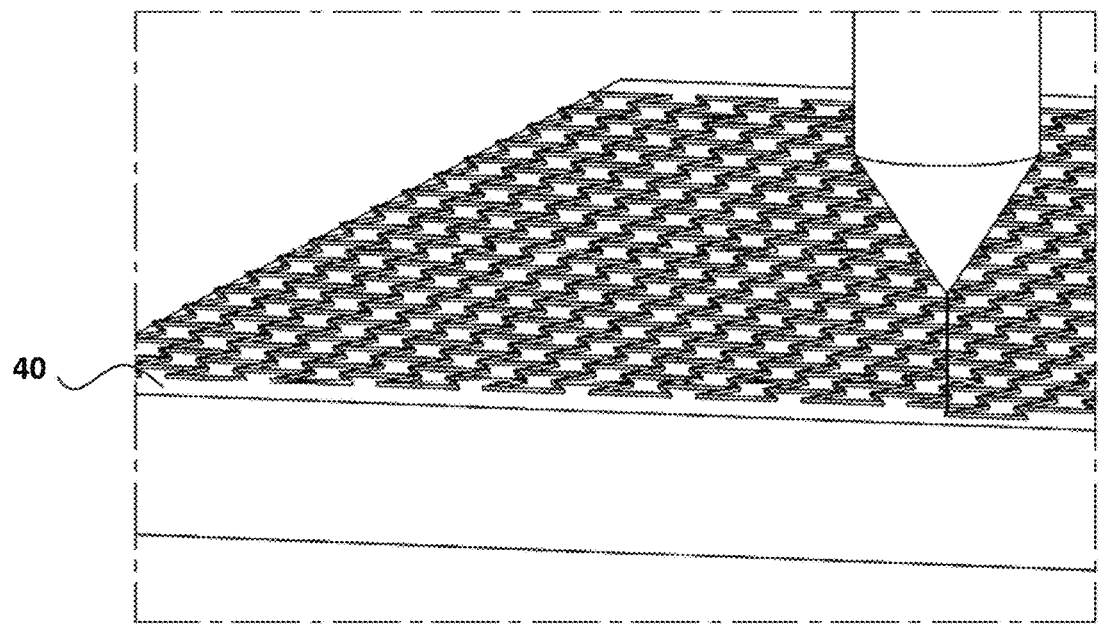
FIG. 2 is an exemplary diagram illustrating a process of manufacturing an auxetic through a printing process according to an embodiment of the present disclosure.

The printing process in the present disclosure may be a process of printing a target object with a designed circuit pattern through an inkjet printer, a laminator, or the like as shown in FIG. 2 and may refer to a roll-to-roll process of forming (or stacking) a specific lattice structure (that is, a plurality of unit structures having a characteristic shape) through a stretchable or elastic material. Such a printing process may refer to a process using a device such as an inkjet device, a pneumatic dispenser, a screw dispenser, a screen printing device, a bar coater, or a spray printing device. The detailed description of the devices used in the above-described printing process is merely an example, and the present disclosure is not limited thereto.

That is, the auxetic 20 constituting the stretchable substrate 100 of the present disclosure may be formed through a printing process using an elastic material. In other words, through the printing process, it may be possible to form the auxetic corresponding to an interval and size of several tens to several hundreds of microns. Thus, it is possible to provide a high degree of freedom in design and a high degree of freedom in material and concurrently provide high efficiency in a large-area process.

As described above, unlike general materials, the auxetic 20 may refer to a material that has a negative Poisson's ratio, that is, is designed such that a transverse strain and a longitudinal strain have the same sign. In other words, the stretchable substrate 100 of the present disclosure is formed through the auxetic 20 which is a mechanical metamaterial designed in a specific lattice structure, thereby controlling a negative Poisson's ratio or a strain in a direction perpendicular to a stretching direction. The Poisson's ratio is an inherent characteristic in a material but is controllable by forming a specific structure in the material. Representative auxetic structures of which a Poisson's ratio is adjustable to a negative value may include, for example, a reentrant structure, a rotating rigid structure, and a chiral structure. The detailed description of the above-described auxetic structure is merely an example, and the present disclosure is not limited thereto.

That is, the stretchable substrate 100 implemented through the auxetic 20 may be a substrate to which unique mechanical properties that do not exist in nature are given by using a new structure. The stretchable substrate 100 may have high applicability in various fields. For example, the stretchable substrate 100 of the present disclosure may be applied to a flexible device, a wearable device, or the like and used to maintain electrical or physical properties of an element against external stress. For another example, when the stretchable substrate 100 of the present disclosure is used in a display field, the stretchable substrate 100 may support deformation in a multidimensional axis direction under various conditions, beyond a fixed display that is folded or rolled in a single direction. Thus, higher variability may be provided to improve a degree of freedom in design and also secure mechanical stability against an external force.

However, when a substrate is formed by introducing an auxetic structure, it may be easy to control a strain on each axis corresponding to two dimensions (for example, an x-axis or a y-axis), but it may be more difficult to control deformation in a direction of a three-dimension-related axis (for example, a z-axis) orthogonal to a two-dimensional plane.

Figure 3:
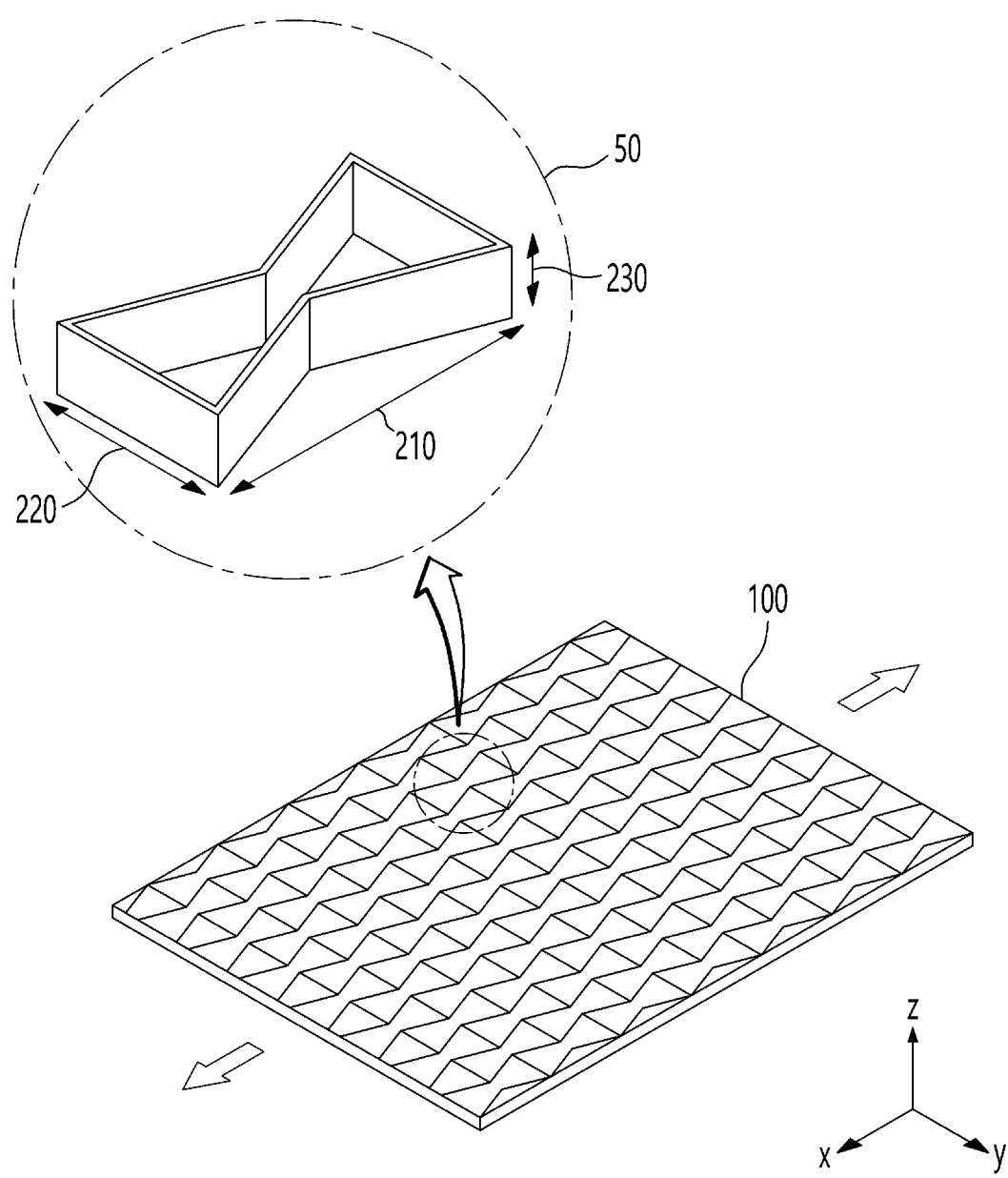
FIG. 3 shows exemplary diagrams for describing deformation in one axial direction occurring in relation to an external force generated in another axial direction according to an embodiment of the present disclosure.

Referring to FIG. 3 for more detailed description, when a tensile force is generated in an x-axis direction, a general elastic substrate may contract in a y-axis direction. On the other hand, since a Poisson's ratio is controllable to a negative value, the stretchable substrate having a structure of the auxetic 20 may expand or remain unchanged in a direction of a y-axis 220 in response to an external force generated along an x-axis 210. That is, when stress is applied in the direction of the x-axis 210, the stretchable substrate may expand in directions of both of the x-axis 210 and the y-axis 220. However, the expansion in the directions of both of the x-axis 210 and y-axis 220 may accelerate contraction in a direction of a z-axis 230. In other words, when an external force for stretching a substrate is generated in the direction of the x-axis 210 or y-axis 220, rapid contraction in the direction of the z-axis 230 occurs, and deformation (that is, contraction) in the direction of the z-axis 230 may cause the distortion of a surface or degrade image quality in a stretchable display field. Additionally, deformation (that is, contraction) in the direction of the z-axis 230 may affect the performance of display-related elements disposed adjacent to a substrate surface. In particular, when the performance of an element is directly affected by a shape of a surface as in a display or a solar cell, a solution to a corresponding issue may be required.

Accordingly, in the stretchable substrate 100 according to the present disclosure, unevenness occurring on a substrate surface is prevented by controlling contraction in a three-dimensional vertical direction (that is, the direction of the z-axis), thereby securing resolution and visibility. In other words, the stretchable substrate 100 may be designed to control a distribution of mechanical deformation occurring in response to an external force in one axial direction of a two-dimensional direction.

Figure 4:
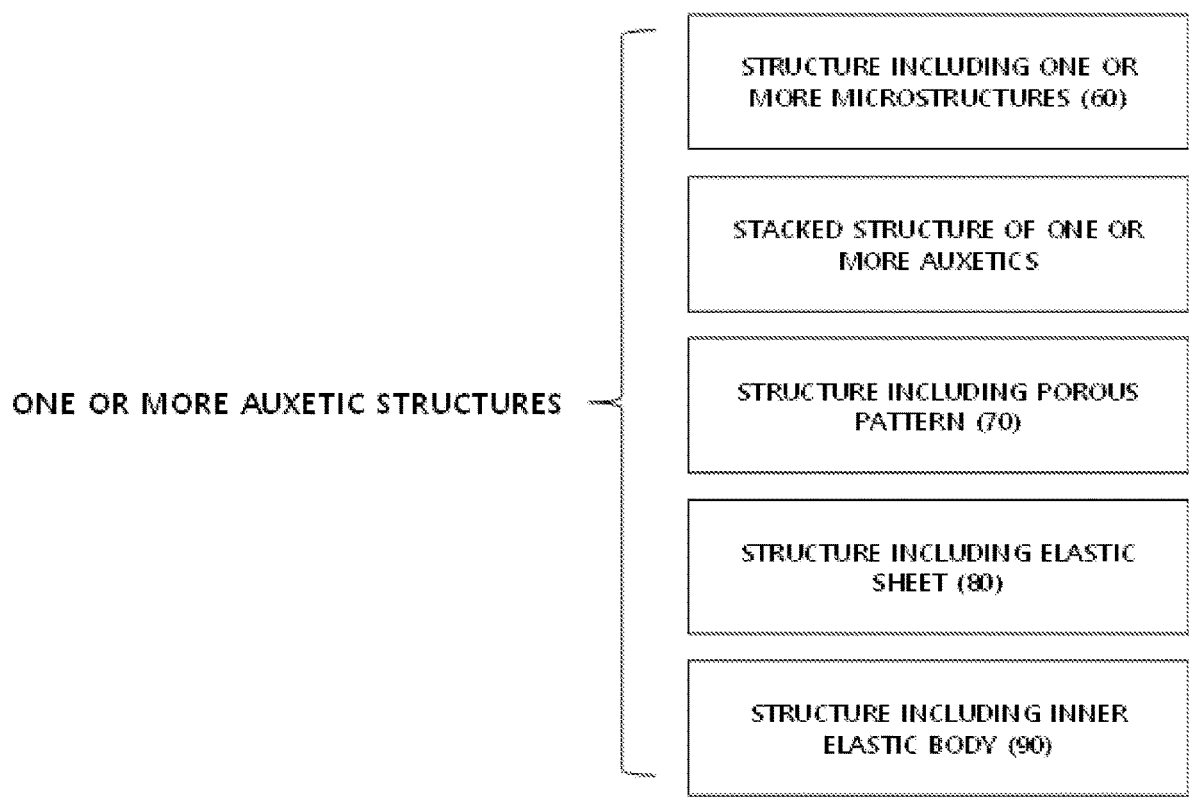
FIG. 4 is an exemplary diagram of one or more auxetic structures according to an embodiment of the present disclosure.

Specifically, since the stretchable substrate 100 of the present disclosure is implemented through one or more auxetic structures, unevenness of a surface is minimized by controlling a distribution of mechanical deformation occurring in a three-dimensional vertical direction, thereby reducing surface distortion. As shown in FIG. 4, one or more auxetic structures of the present disclosure may include a structure including one or more microstructures 60, a stacked structure of one or more auxetic structures, a structure including a porous pattern 70, a structure including an elastic sheet 80, and a structure including an inner elastic body 90. Since the stretchable substrate 100 of the present disclosure is implemented through one or more auxetic structures as described above, mechanical deformation in the direction of the z-axis is dispersed in a downward direction of the substrate to prevent unevenness of a surface, thereby providing an effect of preventing display distortion and providing an effect of preventing damage to adjacent elements.

That is, the stretchable substrate 100 may have high applicability in various fields, and in particular, in relation to a stretchable display field, the stretchable substrate 100 may allow a display with improved resolution or improved quality to be provided. More specific methods of manufacturing the stretchable substrate 100 of the present disclosure, structural features thereof, and effects thereof will be described below with reference to FIGS. 5A to 16.

According to one embodiment of the present disclosure, a stretchable substrate 100 may be implemented through an auxetic structure including one or more microstructures 60. The stretchable substrate 100 including one or more microstructures will be described in detail below with reference to FIGS. 5A to 7.

In the present disclosure, one or more microstructures 60 may be provided in a surface layer of a substrate to control mechanical deformation in a three-dimensional axis direction in response to an external force generated in a two-dimensional axis direction. The microstructures 60 may include at least one of a first microstructure 61 and a second microstructure 62. One or more microstructures 60 may be formed through a process of providing one or more microstructures 60 in a surface layer related to a surface of a substrate. One or more microstructures 60 may control contraction in a direction of a three-dimensional axis (for example, a z-axis), thereby minimizing distortion occurring on the surface.

Figure 5A:
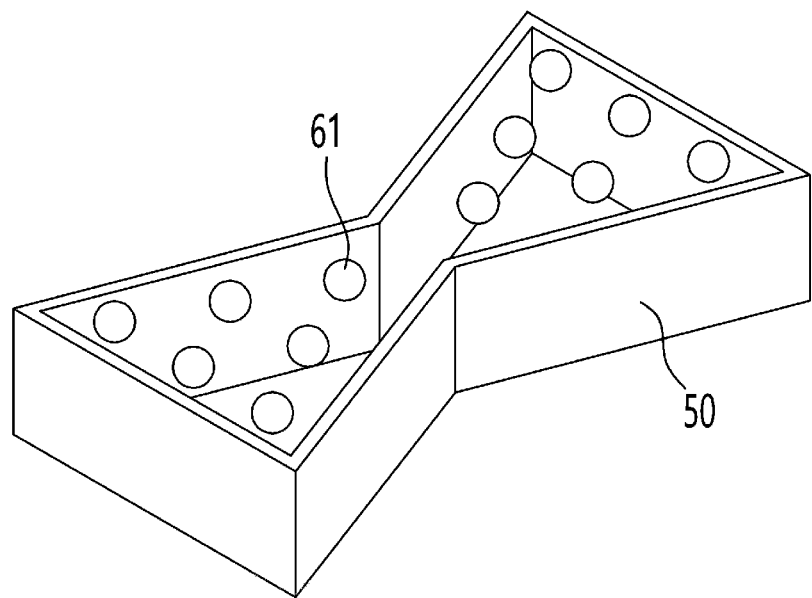
FIGS. 5A and 5B show exemplary diagrams for describing one or more first microstructures according to an embodiment of the present disclosure.
Figure 5B:
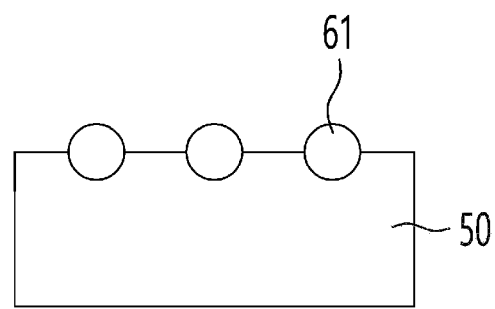

Specifically, one or more microstructures 60 may include one or more first microstructures 61, and the first microstructures 61 may be formed to correspond to a shape and area of each of a plurality of unit structures. For example, an auxetic 20 may be provided through various structures such as a reentrant structure, a rotating rigid structure, or a chiral structure. One or more first microstructures 61 may be formed to correspond to the auxetic 20 having various structures. For a specific example, when the auxetic 20 is provided through the reentrant structure, one unit structure 50 included in the plurality of unit structures may be provided in a ribbon shape shown in FIG. 5A, and one or more first microstructures 61 may be provided in the unit structure 50. In this case, one or more first microstructures 61 may be provided as an elastic body having a relatively higher Young's modulus (coefficient indicating a degree in which a relative length of an elastic object is changed in response to stress) than other elastic bodies forming a substrate. In addition, as shown in FIG. 5B, one or more first microstructures 61 may be provided to partially protrude at positions related to a surface layer of a substrate. In addition, at least a portion of one or more first microstructures may be provided in a hemispherical shape, and one or more first microstructures may be formed in a very small size (for example, a microunit) so as to not affect visibility.

Accordingly, one or more first microstructures 61 formed in the surface layer may disperse mechanical deformation related to the surface layer in a downward direction. That is, when contraction occurs in a direction of a three-dimensional axis (for example, the z-axis), one or more first microstructures 61 formed in the surface layer of the substrate may disperse mechanical deformation in a downward direction to minimize the deformation of the surface layer, thereby reducing the distortion of a surface.

In addition, as the number of the plurality of unit structures included in the auxetic 20 is large or an area of each unit structure is increased, when the auxetic 20 is stretched in a two-dimensional axis direction, an area in which a surface collapses may be increased. That is, the number of the provided unit structures or an area of each structure may have a correlation with information about occurrence of the distortion of a surface. Accordingly, the first microstructures 61 included in the stretchable substrate 100 of the present disclosure may be formed in proportion to the number or area of the unit structures. For example, when a unit area of each of the plurality of unit structures is relatively large, a relatively large number of the first microstructures 61 may be formed in each unit structure. In addition, for example, when the number of the plurality of unit structures is large, a larger number of the first microstructures 61 may be formed in the auxetic including the unit structures. That is, in the stretchable substrate of the present disclosure, the position and number of the provided first microstructures 61 may be determined based on the shape and area of the plurality of unit structures.

In other words, in the stretchable substrate 100 of the present disclosure, a distribution of mechanical stress may be controlled through the introduction of one or more first microstructures 61. That is, when the first microstructures 61 having a high Young's modulus are provided and a substrate is two-dimensionally stretched through a strain-coupling effect, a distribution of mechanical deformation occurring in relation to the z-axis can be distributed as much as possible in a downward direction of the substrate. Accordingly, it is possible to provide an effect of minimizing the distortion of a surface and an effect of preventing damage to elements provided adjacent to the surface.

In addition, one or more microstructures 60 may include one or more second microstructures 62, and each of the one or more second microstructures 62 may be provided in contact with one end surface inside each of the plurality of unit structures. Such one or more second microstructures 62 may be provided to correspond to the number or shape of the plurality of unit structures.

Figure 6A:
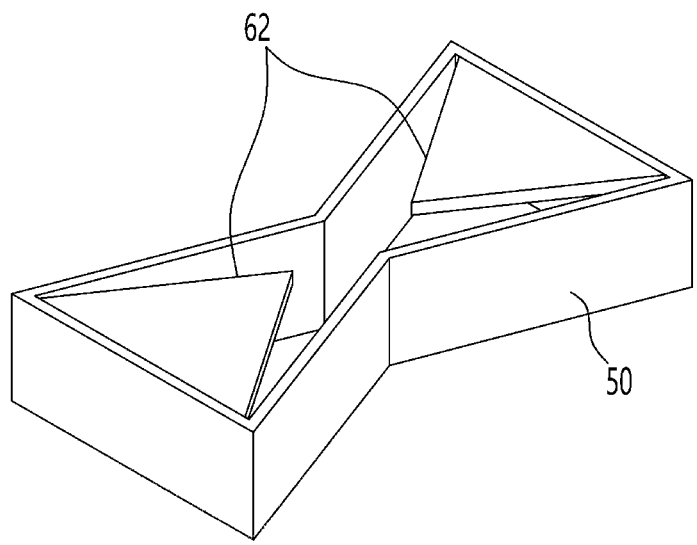
FIGS. 6A and 6B show exemplary diagrams for describing one or more second microstructures according to an embodiment of the present disclosure.
Figure 6B:
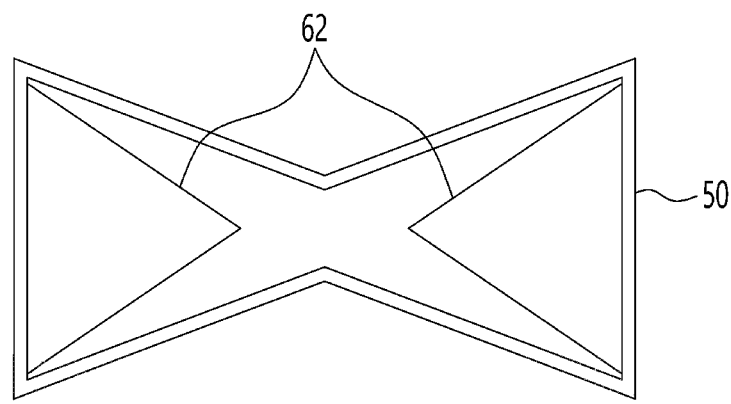

For example, when the auxetic 20 is provided through the reentrant structure, one unit structure 50 included in the plurality of unit structures may be provided through a ribbon shape shown in FIG. 6A, and one or more second microstructures 62 may be provided in the unit structure 50. In this case, as shown in FIG. 6B, one or more second microstructures 62 may be provided in two triangular shapes so as to correspond to one unit structure 50. In addition, one end of each of the two second microstructures may be provided in contact with both ends of the unit structure 50. Here, one end surface of each unit structure, on which each of the one or more second microstructures 62 is provided, may be one end surface that does not inhibit mechanical deformation for implementing a negative Poisson's ratio (for example, each of the one or more second microstructures 62 may be formed on one end surface that does not inhibit a ribbon structure of FIG. 6B from spreading). In other words, one or more second microstructures 62 may be in contact with one end surfaces inside each of the plurality of unit structures and may be provided in each of the plurality of unit structures. When an area of the plurality of unit structures is increased in response to stretching in one axial direction, the second microstructure 62 may complement the increased area of the unit structure to support a surface thereof. That is, since two second microstructures 62 having a triangular shape serve as a support for preventing a surface from collapsing, it is possible to minimize the distortion of the surface and prevent damage to elements adjacent to the surface.

In the above description given with reference to FIGS. 6A and 6B, the second microstructures 62, which are provided in two triangular shapes in the unit structure because the auxetic is formed through the reentrant structure, have been described, but it will be apparent to those skilled in the art that the shape, number, or contact position of the provided second microstructures may be changed according to various implementation aspects of the auxetic.

Figure 7:
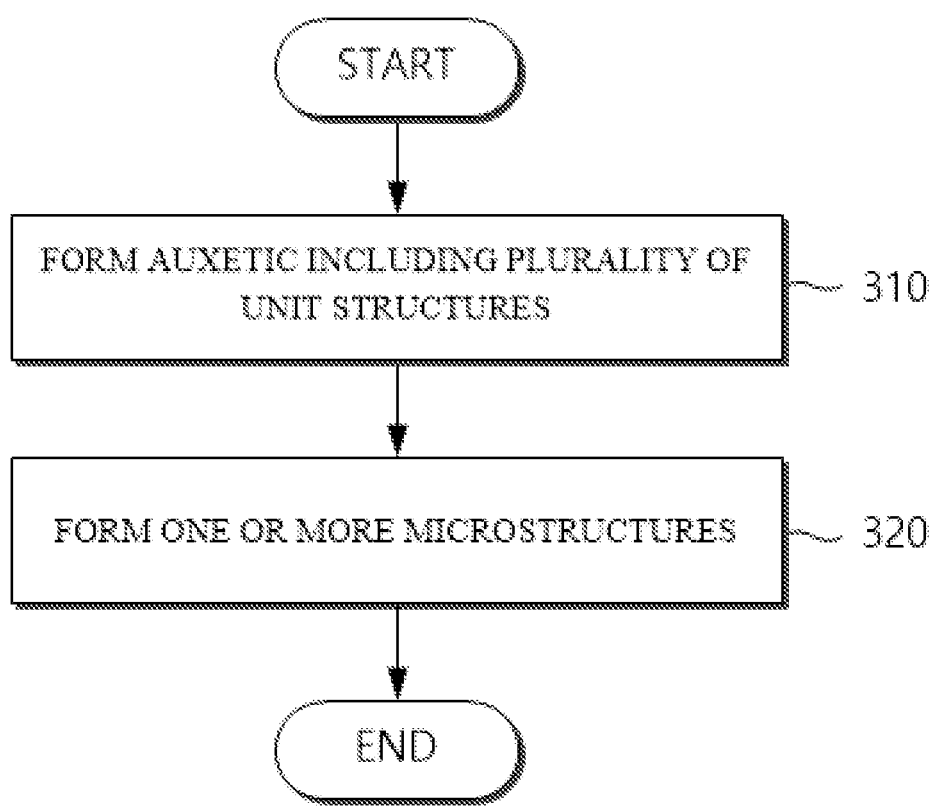
FIG. 7 is an exemplary flowchart illustrating a method of manufacturing a stretchable substrate including one or more microstructures according to an embodiment of the present disclosure.

The stretchable substrate 100 including one or more microstructures 60 as described above may be formed through operations shown in FIG. 7. FIG. 7 is an exemplary flowchart illustrating a method of manufacturing a stretchable substrate including one or more microstructures 60 according to an embodiment of the present disclosure. According to one embodiment, the method of manufacturing a stretchable substrate may include the following operations. A sequence of the operations shown in FIG. 7 may be changed as needed, and one or more operations may be omitted or added. That is, the above-described operations are merely one embodiment of the present disclosure, and the scope of the present disclosure is not limited thereto. The contents described with reference to FIGS. 5A to 6B are referenced for the features that overlap the features described above with reference to FIGS. 5A to 6B among the features of the contents shown in FIG. 7, and descriptions thereof will be omitted here.

According to one embodiment of the present disclosure, the method of manufacturing a stretchable substrate including one or more microstructures includes operation 310 of forming an auxetic including a plurality of unit structures and operation 320 of forming one or more microstructures.

Here, one or more microstructures 60 may include one or more first microstructures 61. One or more first microstructures 61 may be formed to protrude from one surface so as to correspond to the shape and area of each of the plurality of unit structures.

Specifically, operation 320 of forming one or more microstructures may include forming one or more first microstructures 61 on a fixing surface 40, forming a substrate part 10 made of an elastic material, and separating the fixing surface 40.

Here, the fixing surface 40 may be provided to temporarily support the first microstructures 61 in a process of forming one or more microstructures 60 and may be separated (detached) from one or more microstructures 60 after a printing process. In other words, the fixing surface 40 may refer to a separate support that serves to temporarily support the microstructures in the process of forming one or more microstructures 60.

A printing process of forming one or more first microstructures 61 on one side of the fixing surface 40 serving as a temporary support may be performed, and the substrate part 10 may be formed on one or more first microstructures 61. The substrate part 10 may be provided to fix one or more first microstructures 61 and may be provided in a shape of a thin film. In addition, the substrate part 10 may be made of a material having an elastic force. That is, the substrate part 10 may be provided in a shape of a thin film that fixes at least a portion of the one or more first microstructures 61.

The substrate part 10 is formed in one direction of the fixing surface 40 on which the one or more first microstructures 61 are formed, and the substrate part 10 is brought into contact with one or more first microstructures 61 to perform curing thereon. In this case, the performed curing may refer to first curing for coupling (or bonding) the first microstructures 61 and the substrate part 10 and, for example, may refer to low temperature curing performed for 2.5 hours at a temperature of 80° C. In addition, the fixing surface 40 may be separated after the curing, thereby forming the substrate part 10 on which one or more first microstructures 61 are formed.

In an additional embodiment, operation 320 of forming one or more microstructures 60 may further include treating the fixing surface 40 with a release preventing agent. In this case, the release preventing agent may be applied, printed, or sprayed. The release preventing agent is provided to facilitate the separation of the fixing surface 40, and before one or more microstructures 60 are formed on the fixing surface 40, the release preventing agent may be applied, printed, or sprayed on the fixing surface 40. That is, the substrate part 10 including one or more first microstructures 61 can be easily separated from the fixing surface through the release preventing agent applied between the fixing surface 40 and one or more first microstructures. That is, convenience of a delamination process of one or more first microstructures 61 can be improved.

In addition, operation 310 of forming the auxetic may include forming an auxetic 20 on the substrate part 10 including one or more first microstructures and forming a fixing part 30. In this case, one or more first microstructures 61 from which the fixing surface 40 is separated may refer to one or more first microstructures 61 formed on the substrate part 10. That is, the substrate part 10, which is a thin elastic film, may fix one or more first microstructures 61, and a printing process of forming the auxetic on one surface of the substrate part 10 may be performed in a state in which one or more first microstructures are fixed. In addition, after a process of forming the auxetic on one surface of the substrate part 10 is performed, the first curing may be performed. Here, the first curing may refer to curing for coupling (or bonding) the substrate part 10 and the auxetic 20. In addition, second curing may be performed on the substrate part 10 and the auxetic 20 coupled to each other through the first curing. In this case, the second curing may be curing for increasing a mechanical strength of the auxetic 20 and may include curing conditions such as a longer curing time and a higher curing temperature as compared with the first curing. For example, the second curing may refer to high temperature curing performed for 24 hours at a temperature of 165° C.

In addition, after the second curing is performed, the fixing part 30 may be formed on the substrate part on which the auxetic 20 is formed (that is, the substrate part including one or more first microstructures and the auxetic). Specifically, the fixing part 30 in a liquid state may be supplied to the substrate part 10 coupled with the auxetic 20, and third curing may be performed. That is, after the fixing part 30 made of an elastic material in a liquid state is supplied and brought into contact with the substrate part 10 and the auxetic 20, the third curing is performed to manufacture a stretchable substrate including one or more first microstructures. In this case, the third curing may refer to curing for coupling (or bonding) the auxetic 20 and the fixing part 30 and refer to curing that includes the same curing conditions as the first curing. That is, the stretchable substrate including one or more first microstructures formed to protrude from one surface thereof may be manufactured through the above-described processes. In this case, protruding portions of one or more first microstructures may constitute a surface layer of the manufactured substrate. Such one or more first microstructures may be provided as an elastic body having a higher Young's modulus than other elastic bodies constituting the stretchable substrate 100 and may be provided to correspond to the surface layer of the substrate, thereby dispersing mechanical deformation related to the surface layer in a downward direction. That is, when contraction occurs in a direction of a three-dimensional axis (for example, a z-axis), one or more first microstructures 61 formed in the surface layer of the substrate may disperse mechanical deformation in a downward direction to minimize the deformation of the surface layer, thereby reducing the distortion of a surface.

According to another embodiment of the present disclosure, operation 320 of forming the one or more microstructures 60 may include forming the substrate part 10 made of an elastic material and forming one or more first microstructures 61 on the substrate part 10. In this case, the substrate part 10 may be provided to fix one or more first microstructures 61 and may be provided in a shape of a thin film. Specifically, the substrate part 10 may fixe one or more microstructures 60 and may couple and fix a portion of the auxetic and one or more microstructures through curing. In addition, the substrate part 10 may be made of a material having an elastic force. That is, the substrate part 10 may be provided in a shape of a thin film that fixes at least a portion of one or more first microstructures 61.

In addition, operation 310 of forming the auxetic 20 may include forming the auxetic 20 on the substrate part 10, on which one or more microstructures 60 are provided, and forming the fixing part 30.

Specifically, a printing process for the auxetic 20 is performed on the substrate part 10 including one or more microstructures 60, and first curing for coupling the substrate part 10 and the auxetic 20 may be performed. In addition, second curing may be performed on the substrate part 10 and the auxetic 20 coupled to each other through the first curing. In this case, the second curing may be curing for increasing a mechanical strength of the auxetic 20. After the second curing is performed, the fixing part 30 may be formed on the substrate part 10 on which the auxetic 20 is formed.

That is, a stretchable substrate including one or more first microstructures 61 may be manufactured through the above-described processes. In this case, before a process of one or more first microstructures, a process of thinly applying an elastic body to form the substrate part 10 and forming one or more first microstructures 61 on one surface of the substrate part 10 may be performed, and thus, one or more first microstructures 61 may be formed by being included in the stretchable substrate 100 through the substrate part 10. That is, one or more first microstructures 61 may be encapsulated and thus may be prevented from being separated from the stretchable substrate 100. Accordingly, it is possible to improve the sustainability of effects of preventing surface distortion of the stretchable substrate 100 and preventing damage to elements. In other words, it is possible to improve the operation efficiency of the stretchable substrate 100.

According to still another embodiment of the present disclosure, operation 310 of forming the auxetic may include forming the substrate part 10 and forming the auxetic 20 on the substrate part 10. In this case, operation 320 of forming one or more microstructures may include forming the fixing part 30 on the substrate part 10 on which the auxetic 20 is formed and forming one or more first microstructures 61 on the substrate part 10.

Specifically, a process of forming the substrate part 10 having a shape of a thin elastic film and forming the auxetic 20 on one surface of the formed substrate part 10 may be performed. After the process of forming the auxetic on one surface of the substrate part 10 is performed, first curing may be performed. Here, the first curing may refer to curing for coupling the substrate part 10 and the auxetic 20. In addition, second curing may be performed on the substrate part 10 and the auxetic 20 coupled to each other through the first curing. In this case, the second curing may be curing for increasing a mechanical strength of the auxetic 20 and may include curing conditions such as a longer curing time and a higher curing temperature as compared with the first curing. For example, the second curing may refer to high temperature curing performed for 24 hours at a temperature of 165° C. In addition, after the second curing is performed, the fixing part 30 may be formed on the substrate part 10 on which the auxetic 20 is formed. Specifically, the fixing part in a liquid state may be supplied to the substrate part 10 coupled with the auxetic 20, and third curing may be performed. After the fixing part 30 made of an elastic material in a liquid state is supplied and brought into contact with the substrate part 10 and the auxetic 20, the third curing may be performed. In addition, after the third curing is performed, a printing process of forming one or more first microstructures on the substrate part 10 may be performed. In this case, the printing process of forming one or more first microstructures may refer to a process of printing one or more first microstructures, of which at least portion has a hemispherical shape, on the substrate part 10 forming a surface layer. According to embodiments, at least a portion of one or more first microstructures may be included in the substrate part 10 through the printing process, and at least a portion thereof may be formed to protrude outward from the substrate part 10.

That is, as described above, after a process of forming the stretchable substrate 100 through the substrate part 10, the auxetic 20, and the fixing part 30 is performed, a process of printing one or more first microstructures 61 on the substrate part 10 corresponding to the surface layer may be performed to manufacture a stretchable substrate including one or more first microstructures.

In addition, one or more microstructures 60 may include one or more second microstructures 62. Each of the one or more second microstructures 62 may be provided in contact with one end surface inside each of the plurality of unit structures. In addition, one or more second microstructures 62 may be provided to correspond to the number or shape of the plurality of unit structures.

Operation 320 of forming one or more microstructures may include forming the substrate part 10 and forming the auxetic 20 on the substrate part 10. In this case, the forming of the auxetic 20 on the substrate part 10 may be performed by forming or printing the auxetic including one or more second microstructures 62.

Specifically, a process of forming the substrate part 10 having a shape of a thin elastic film and forming the auxetic 20 on one surface of the formed substrate part 10 may be performed. In this case, the process of forming the auxetic 20 on one surface of the substrate part 10 may be a process of printing the auxetic 20 including one or more second microstructures 62.

For a specific example, in the case of a process of forming (or printing) the auxetic 20 having a reentrant structure in which each of the plurality of unit structures has a ribbon shape as shown in FIG. 6A, the process of forming the auxetic 20 may be performed such that the second microstructures 62 having two triangular shapes are included in each unit structure 50. In this case, each of the one or more second microstructures 62 may be formed in contact with one end surface of each unit structure in the process of forming the auxetic 20. One end surface of each unit structure, with which each of the one or more second microstructures 62 is in contact, may be one end surface that does not inhibit mechanical deformation for implementing a negative Poisson's ratio (for example, each of the one or more second microstructures 62 may be formed on one end surface that does not inhibit a ribbon structure in FIG. 6B from spreading). In other words, a process of forming the auxetic 20 including one or more second microstructures 62 in contact with one end surfaces of each of the plurality of unit structures may be performed. Accordingly, one or more second microstructures 62 may be formed in contact with one end surfaces inside each of the plurality of unit structures and may be formed to be provided in each of the plurality of unit structures.

When an area of the plurality of unit structures is increased in response to stretching in one axial direction, the second microstructures 62 may complement the increased area of the unit structure to support a surface thereof. That is, since two second microstructures 62 having a triangular shape serve as a support for preventing a surface from collapsing, it is possible to minimize the distortion of the surface and prevent damage to elements adjacent to the surface.

Through the above-described process processes, the stretchable substrate 100 of the present disclosure may be provided to include one or more microstructures in a surface layer thereof. One or more microstructures 60 may control mechanical deformation in a three-dimensional axis direction in response to an external force generated in a second-dimensional axis direction. That is, when the stretchable substrate 100 contracts in a three-dimensional axis direction in response to a tensile force in a two-dimensional axis direction, the deformation of the surface layer is minimized through one or more microstructures formed in the surface layer, thereby providing an effect of preventing the distortion of the surface and providing an effect of preventing damage to adjacent elements.

According to embodiments of the present disclosure, a stretchable substrate 100 may be implemented by stacking one or more auxetics. The stretchable substrate 100 including one or more auxetics will be described in detail below with reference to FIGS. 8, 9, and 10.

Figure 8:
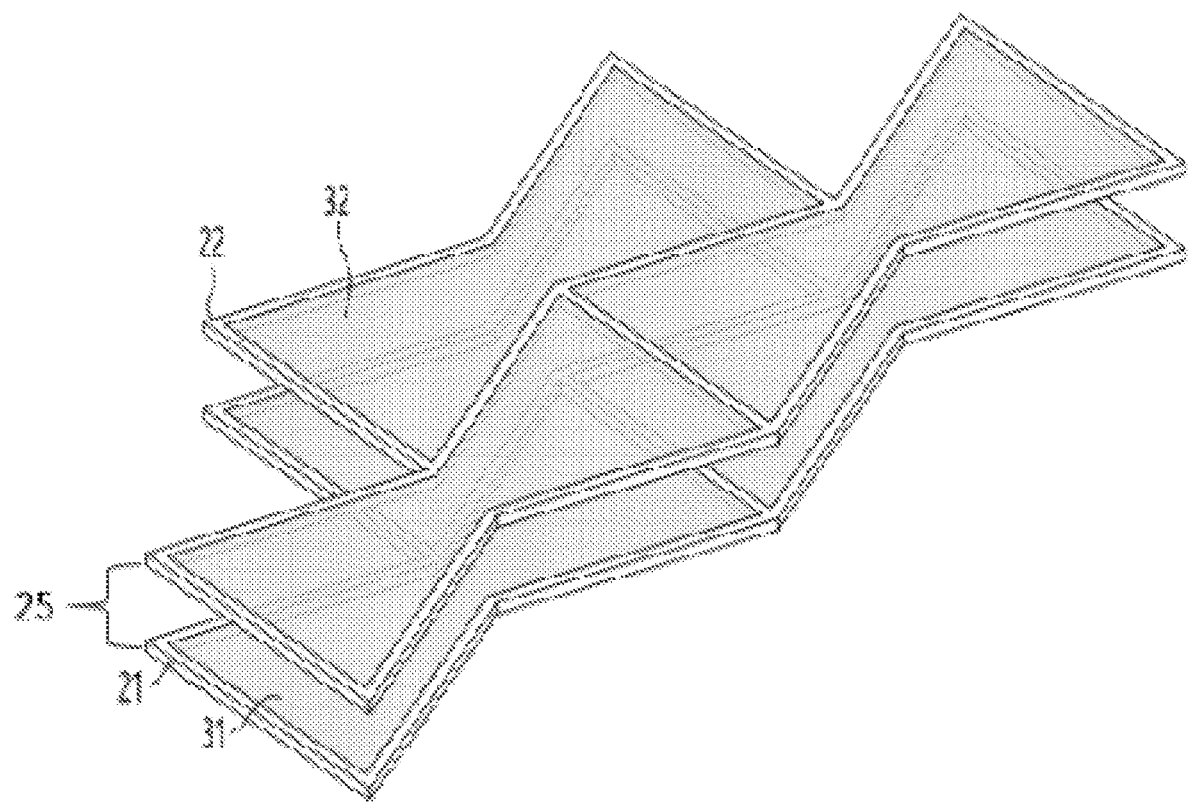
FIG. 8 is an exemplary diagram for describing a stacked structure of one or more auxetics according to an embodiment of the present disclosure.

In the present disclosure, the stacking of one or more auxetics may be for minimizing a surface unevenness due to mechanical deformation in a three-dimensional axis direction by stacking and providing one or more auxetics. As shown in FIG. 8, the stacking of one or more auxetics may include stacking a first auxetic 21 including a plurality of first unit structures and stacking a second auxetic 22 including a plurality of second unit structures. In addition, an inner elastic body 90 may fill a space between the first auxetic 21 and the second auxetic 22. In this case, the inner elastic body 90 may be made of an elastic material having a negative Poisson's ratio.

For example, when one auxetic is provided, excluding a fixing part (for example, an elastic body), the auxetic itself may not be deformed in a three-dimensional axis direction (that is, a z-axis direction) due to a relatively high strength of the auxetic. That is, only a fixing part 30 filling each of the plurality of unit structures is deformed (that is, a surface collapses to each of the plurality of unit structures), thereby causing the distortion of the surface.

The stretchable substrate 100 of the present disclosure may include one or more stacked auxetics and may include an inner elastic layer positioned between the auxetics. That is, the stretchable substrate 100 may be implemented by stacking the first auxetic 21 and the second auxetic 22. In this case, the inner elastic body may be provided in a form which fills the space between the auxetics.

Accordingly, since the inner elastic body is positioned between the auxetics having relatively high mechanical strength, deformation in a three-dimensional axis direction (for example, the z-axis direction) is possible using the inner elastic body.

In other words, when a contractile force in a three-dimensional direction is generated in response to stretching in a direction of a two-dimensional axis (for example, an x-axis or a y-axis), deformation in a three-dimensional axis direction corresponding to the contractile force is possible using the inner elastic body. A surface is allowed to collectively collapse through the contraction of the inner elastic body provided between the auxetics, thereby preventing the deformation of only the fixing part 30 (that is, an elastic body having relatively low mechanical strength). That is, collective contraction is caused through the inner elastic body provided between one or more auxetics, thereby reducing the distortion of a surface and preventing damage to elements disposed adjacent to the surface.

Specifically, the stretchable substrate 100 may include the first auxetic 21 including a plurality of first unit structures 51 and a first fixing part 31 for fixing the first auxetic 21. In addition, the stretchable substrate 100 may further include a substrate part 10 made of an elastic material. In this case, the substrate part 10 may be provided to support the first auxetic 21 in a process of forming the first auxetic 21 and may be provided in a shape of a thin film. That is, the first auxetic 21 may be formed on the substrate part 10.

In addition, the stretchable substrate 100 may include the second auxetic 22 including a plurality of second unit structures 52 and a second fixing part 32 for fixing the second auxetic 22. In this case, the second auxetic 22 may be formed with respect to the first fixing part 31 and stacked on the first auxetic 21.

According to one embodiment, the second unit structure 52 included in the second auxetic 22 may be provided to have a size different from that of the first unit structure 51 included in the first auxetic. Specifically, the first auxetic 21 and the second auxetic 22 may be fixed through the first fixing part 31 and the second fixing part 32, respectively. In this case, each auxetic may be provided to have mechanical strength higher than that of each fixing part. For example, since the auxetic is cured through different curing conditions from the fixing part, the auxetic may be provided to have mechanical strength higher than that of the fixing part. For a specific example, since the auxetic is cured through curing conditions including a higher curing agent ratio, a longer curing time, and a higher curing temperature as compared with the fixing part, the auxetic may be provided to have mechanical strength higher than that of the fixing part.

That is, each of the first and second auxetics 21 and 22 may have mechanical strength higher than that of each of the first and second fixing parts 31 and 32. Accordingly, each of the first and second auxetics 21 and 22 may not be deformed in a three-dimensional axis direction. That is, only the first and second fixing parts 31 and 32 filling the plurality of unit structures included in the auxetics are deformed, thereby causing the distortion of a surface.

Accordingly, in order to minimize contraction in a three-dimensional axis direction through the fixing parts, the second unit structure 52 and the first unit structure 51 may be provided to have different sizes. That is, the second unit structure 52 included in the second auxetic 22 may be provided to have the size different from that of the first unit structure 51 included in the first auxetic 21. Accordingly, when the first and second auxetics 21 and 22 are stacked, the first unit structure 51 and the second unit structure 52 may not correspond to each other. For example, at least a portion of each of the plurality of second unit structures may be positioned in an inner space formed by each of the plurality of first unit structures.

That is, contraction directions of the first fixing part 31 and the second fixing part 32 do not correspond to each other, and thus, contraction in a three-dimensional axis direction can be minimized through the first and second auxetics 21 and 22 having relatively high mechanical strength.

Figure 9:
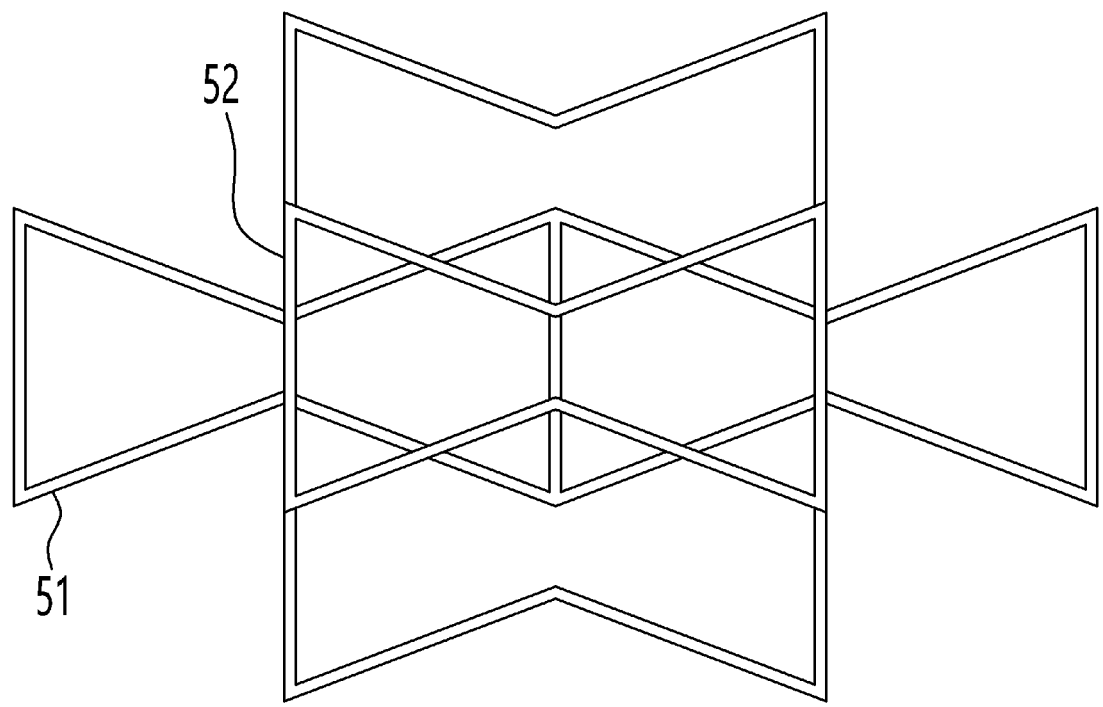
FIG. 9 is an exemplary plan view illustrating a stacked structure of one or more auxetics according to an embodiment of the present disclosure.

In addition, according to one embodiment, the second auxetic 22 may be stacked on the first auxetic 21 such that each of the plurality of second unit structures 52 is misaligned with each of the plurality of first unit structures 51. The stacking of the auxetic such that each of the plurality of second unit structures 52 is misaligned with each of the plurality of first unit structures 51 is for reducing contraction in a three-dimensional direction by making a formation direction of the first fixing part 31 different from a formation direction of the second fixing part at the time of the stacking. For a specific example, as shown in FIG. 9, when the first unit structure 51 and the second unit structure 52 are stacked to be misaligned with each other, since the first fixing part 31 and the second fixing part 32 filling the first unit structure 51 and the second unit structure 52 in inner directions thereof do not correspond to each other, contraction in a z-axis direction can be reduced by each auxetic. Accordingly, contraction in a three-dimensional axis direction can be controlled, thereby reducing the distortion of a surface.

In addition, the stretchable substrate 100 may include the inner elastic layer provided between the first auxetic 21 and the second auxetic 22. That is, the stretchable substrate 100 of the present disclosure may include one or more stacked auxetics and may be implemented by filling a space between the auxetics with the inner elastic body 90.

Accordingly, since the inner elastic body is positioned between the auxetics having relatively high mechanical strength, deformation in a three-dimensional axis direction (for example, the z-axis direction) is possible using the inner elastic body.

In other words, when a contractile force in a three-dimensional direction is generated in response to stretching in a direction of a two-dimensional axis (for example, the x-axis or the y-axis), deformation in a three-dimensional axis direction corresponding to the contractile force is possible using the inner elastic body. A surface is allowed to collectively collapse through the contraction of the inner elastic body provided between the auxetics, thereby preventing a surface unevenness caused through the contraction of the fixing part. That is, collective contraction is caused through the inner elastic body provided between one or more auxetics, thereby reducing the distortion of a surface and preventing damage to elements disposed adjacent to the surface.

Figure 10:
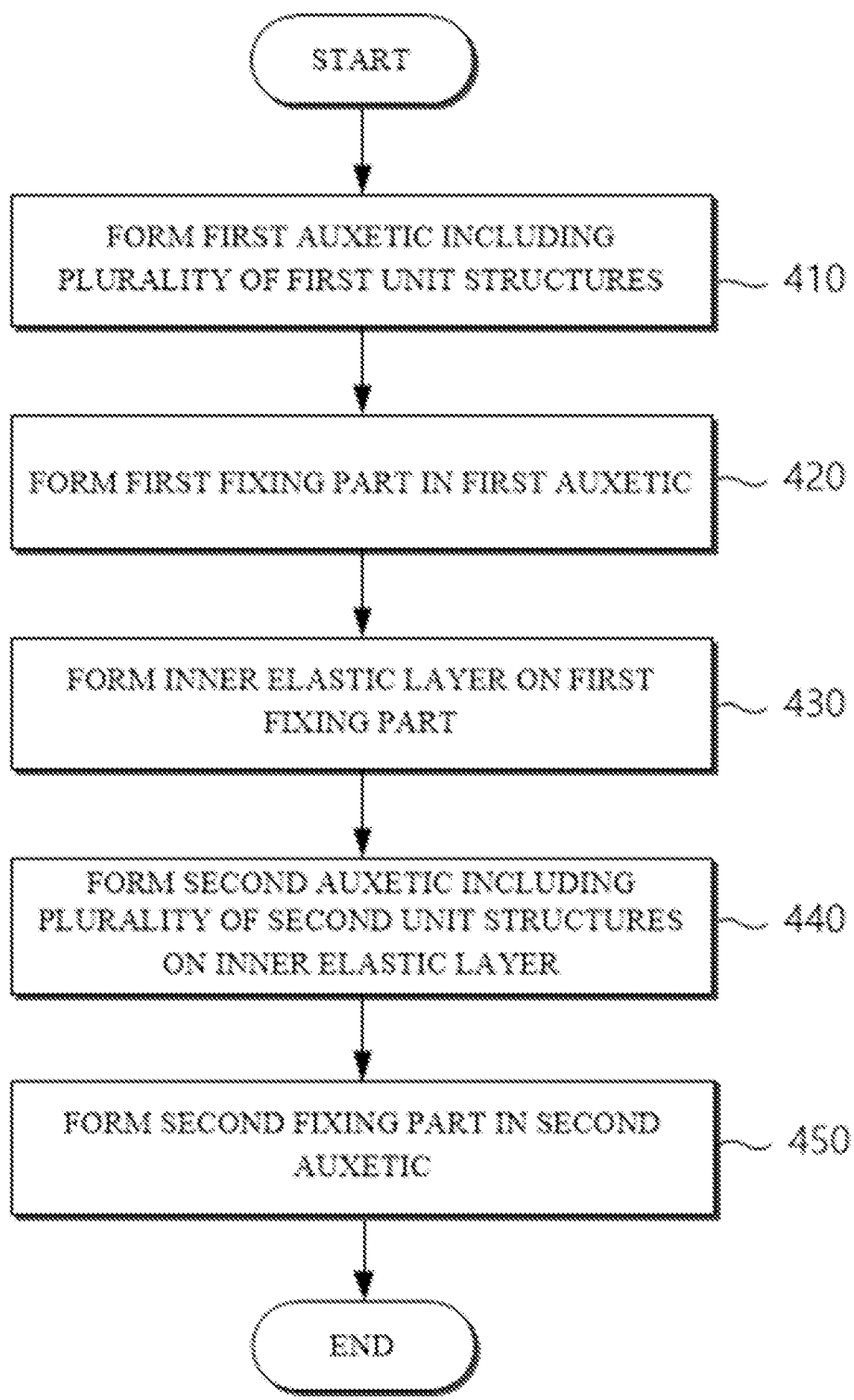
FIG. 10 is an exemplary flowchart illustrating a method of manufacturing a stretchable substrate including a stacked structure of one or more auxetics according to an embodiment of the present disclosure.

The stretchable substrate 100 including one or more auxetics as described above may be formed through operations shown in FIG. 10. FIG. 10 is an exemplary flowchart illustrating a method of manufacturing a stretchable substrate implemented by stacking one or more auxetics according to an embodiment of the present disclosure. According to one embodiment, the method of manufacturing a stretchable substrate may include the following operations. A sequence of the operations shown in FIG. 10 may be changed as needed, and one or more operations may be omitted or added. That is, the above-described operations are merely one embodiment of the present disclosure, and the scope of the present disclosure is not limited thereto. The contents described with reference to FIGS. 8 and 9 are referenced for the features that overlap the features described above with reference to FIGS. 8 and 9 among the features of the contents shown in FIG. 10, and descriptions thereof will be omitted here.

According to one embodiment of the present disclosure, the method of manufacturing a stretchable substrate implemented by stacking one or more auxetics may include operation 410 of forming a first auxetic including a plurality of first unit structures, operation 420 of forming a first fixing part in the first auxetic, operation 430 of forming an inner elastic layer on the first fixing part, operation 440 of forming a second auxetic including a plurality of second unit structures on the inner elastic layer, and operation 450 of forming a second fixing part in the second auxetic.

According to one embodiment of the present disclosure, operation 410 of forming the first auxetic may include forming a first auxetic 21 on a fixing surface 40 and separating the fixing surface 40. Here, the fixing surface 40 may be provided to temporarily support the first auxetic 21 in a process of forming the first auxetic 21 including the plurality of first unit structures and may be separated from the first auxetic 21 after a printing process. In other words, the fixing surface 40 may refer to a separate support that temporarily supports the first auxetic 21 in the process of forming the first auxetic 21. Curing may be performed after the process of forming the first auxetic 21 on one side of the fixing surface 40. In this case, the performed curing may be curing for increasing a mechanical strength of the first auxetic 21.

According to another embodiment of the present disclosure, operation 410 of forming the first auxetic may include forming a substrate part 10 and forming the first auxetic 21 on the substrate part 10. Specifically, a process of forming the substrate part 10 having a shape of a thin elastic film and forming the first auxetic 21 on one surface of the formed substrate part 10 may be performed. In addition, after the process of forming the first auxetic 21, curing for increasing a mechanical strength of the first auxetic 21 may be performed.

According to an additional embodiment, operation 410 of forming the first auxetic 21 may include forming the first auxetic 21 including a porous pattern 70. The porous pattern may be formed to include one or more holes including an inner space layer. Specifically, the forming of the first auxetic 21 may include forming the substrate part 10 and forming the first auxetic 21 including the porous pattern on the substrate part 10. Accordingly, the first auxetic 21 may be provided to include the porous pattern formed to include one or more holes. Thus, the first auxetic may be allowed to contract through one or more holes in response to a contractile force in a three-dimensional axis direction. That is, deformation in a three-dimensional axis direction (that is, a z-axis direction) may be possible using one or more holes formed in the first auxetic 21. In other words, when a contractile force in a three-dimensional direction is generated in response to stretching in a direction of a two-dimensional axis (for example, an x-axis or a y-axis), deformation in a three-dimensional axis direction corresponding to the contractile force is possible using the porous pattern included in the first auxetic (that is, stress is dispersed in a downward direction), thereby minimizing the distortion of a surface.

In addition, after the first auxetic 21 is formed, a first fixing part 31 in a liquid state is supplied and brought into contact with the first auxetic 21, and then, curing for coupling the first fixing part and the first auxetic 21 may be performed. After the curing is performed, a process of forming the inner elastic layer on the first fixing part 31 may be performed. In this case, the inner elastic layer may be formed by supplying an inner elastic body and may refer to a layer positioned between the first auxetic 21 and a second auxetic 22. According to one embodiment, the inner elastic body may be made of an elastic material having mechanical strength that is lower than that of the first fixing part 31 and a second fixing part 32. Accordingly, the inner elastic layer first contracts in response to a contractile force in a three-dimensional axis direction so that it is possible to induce collective contraction of a substrate surface.

In addition, after the inner elastic layer is formed, the second auxetic 22 including a plurality of second unit structures 52 may be formed on an upper portion of the inner elastic layer. After the second auxetic 22 is formed on the inner elastic layer, curing for improving a mechanical strength of the second auxetic 22 may be performed. In addition, after the curing, the second fixing part 32 in a liquid state may be supplied to the second auxetic 22 formed on the inner elastic layer. After the second fixing part 32 is supplied, curing for coupling the second auxetic 22 and the second fixing part 32 may be performed.

Accordingly, it is possible to manufacture a stretchable substrate 100 including the inner elastic layer between the auxetics having relatively high mechanical strength. Accordingly, deformation in a three-dimensional axis direction (that is, the z-axis direction) may be possible using the inner elastic body positioned between the auxetics.

In other words, when a contractile force in a three-dimensional direction is generated in response to stretching in a direction of a two-dimensional axis (for example, the x-axis or the y-axis), deformation in a three-dimensional axis direction corresponding to the contractile force is possible using the inner elastic body. Thus, a surface is allowed to collectively collapse through the contraction of the inner elastic body provided between the auxetics, thereby preventing a surface unevenness caused through the contraction of the fixing part. That is, collective contraction is caused through the inner elastic body provided between one or more auxetics, thereby reducing the distortion of a surface and preventing damage to elements disposed adjacent to the surface.

According to one embodiment of the present disclosure, a stretchable substrate 100 may be implemented through an auxetic including a porous pattern 70. The stretchable substrate 100 including the porous pattern will be described in detail below with reference to FIGS. 11 and 12.

Figure 11:
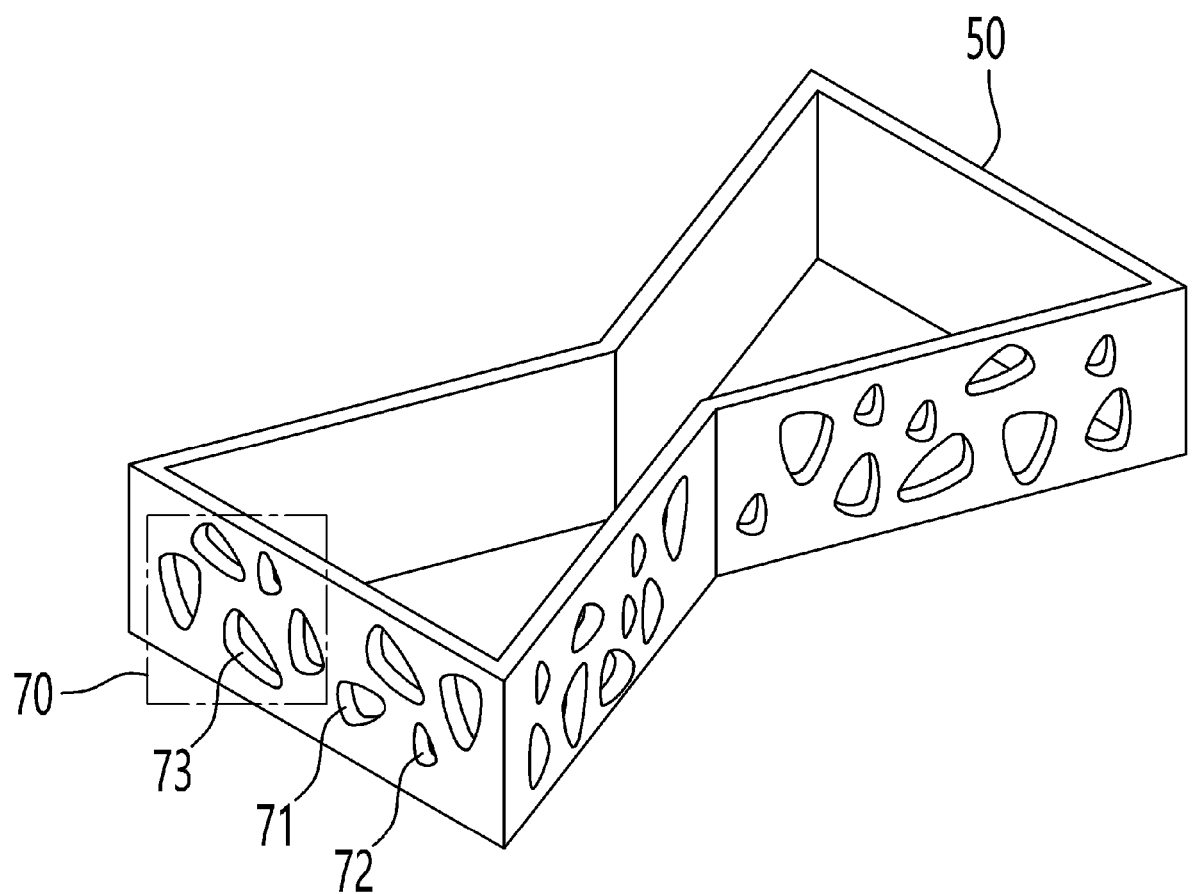
FIG. 11 is an exemplary diagram for describing a porous pattern according to an embodiment of the present disclosure.

In the present disclosure, the porous pattern is for minimizing a surface unevenness due to mechanical deformation in a three-dimensional axis direction by forming one or more holes including an inner space layer in the auxetic in a process of forming the auxetic. As shown in FIG. 11, the porous pattern 70 may refer to one or more holes 71, 72, and 73 formed in an auxetic 20.

For example, the auxetic 20 may be provided to have mechanical strength that is relatively higher than that of a fixing part 30 filling a unit structure 50. Accordingly, when a contractile force in a three-dimensional axis direction is generated in response to a tensile force in a two-dimensional axis direction, excluding the auxetic 20, only the remaining elastic body part (i.e., the fixing part) may contract. That is, only the fixing part 30 filling each of a plurality of unit structures is deformed (that is, a surface collapses to each of the plurality of unit structures), thereby causing the distortion of a surface.

Accordingly, the stretchable substrate 100 of the present disclosure may include the porous pattern 70 formed to include one or more holes in the auxetic 20. Thus, the auxetic 20 may be deformed (that is, contract) through one or more holes in response to a contractile force in a three-dimensional axis direction. That is, deformation in a three-dimensional axis direction (that is, a z-axis direction) may be possible using one or more holes formed in the auxetic 20. In other words, when a contractile force in a three-dimensional direction is generated in response to stretching in a direction of a two-dimensional axis (for example, an x-axis or a y-axis), deformation in a three-dimensional axis direction corresponding to the contractile force is possible using the porous pattern included in the first auxetic (that is, stress is dispersed in a downward direction), thereby minimizing the distortion of a surface.

Figure 12:
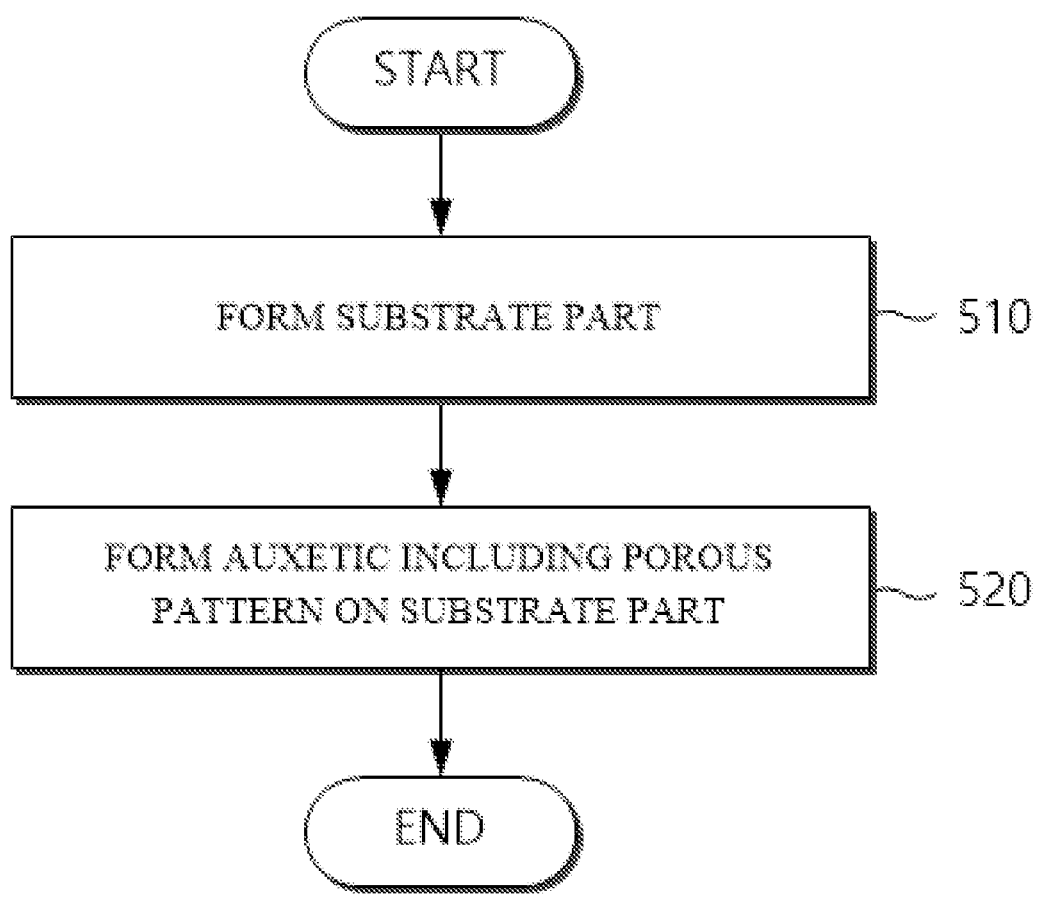
FIG. 12 is an exemplary flowchart illustrating a method of manufacturing a stretchable substrate including a porous pattern according to an embodiment of the present disclosure

The stretchable substrate 100 including the porous pattern as described above may be manufactured through operations shown in FIG. 12. FIG. 12 is an exemplary flowchart illustrating a method of manufacturing a stretchable substrate including a porous pattern according to an embodiment of the present disclosure. According to one embodiment, the method of manufacturing a stretchable substrate may include the following operations. A sequence of the operations shown in FIG. 12 may be changed as needed, and one or more operations may be omitted or added. That is, the above-described operations are merely one embodiment of the present disclosure, and the scope of the present disclosure is not limited thereto. The contents described with reference to FIGS. 1 and 11 are referenced for the features that overlap the features described above with reference to FIGS. 1 and 11 among the features of the contents shown in FIG. 12, and descriptions thereof will be omitted here.

According to one embodiment of the present disclosure, the method of manufacturing a stretchable substrate including a porous pattern may include operation 510 of forming a substrate part 10 and operation 520 of forming an auxetic including a porous pattern on the substrate part 10.

Specifically, a process of forming the substrate part 10 having a shape of a thin elastic film and forming an auxetic 20 on one surface of the formed substrate part 10 may be performed. In this case, the process of forming the auxetic 20 on one surface of the substrate part 10 may refer to a process of forming the auxetic 20 so as to include a porous pattern that forms one or more holes with an inner space. After the process of forming the auxetic 20 including the porous pattern on the substrate part 10 is performed, first curing for coupling the substrate part 10 and the auxetic 20 including the porous pattern may be performed. In addition, after the first curing is performed, second curing for improving a mechanical strength of the auxetic 20 may be performed. After the second curing, a fixing part 30 may be supplied to the auxetic including the porous pattern, and after the supply of the fixing part 30, third curing for coupling the fixing part 30 and the auxetic 20 may be performed.

Accordingly, it is possible to manufacture a stretchable substrate 100 including the porous pattern. The stretchable substrate 100 of the present disclosure may be deformed (for example, contract) through one or more holes in response to a contractile force in a three-dimensional axis direction. In other words, when a contractile force in a three-dimensional direction is generated in response to stretching in a direction of a two-dimensional axis (for example, an x-axis or a y-axis), deformation in a three-dimensional axis direction corresponding to the contractile force is possible using the porous pattern included in the auxetic, thereby minimizing the distortion of a surface.

According to one embodiment of the present disclosure, a stretchable substrate 100 may be implemented through an auxetic structure including one or more elastic sheets 80. The stretchable substrate 100 including one or more elastic sheets 80 will be described in detail below with reference to FIGS. 13 and 14.

In the present disclosure, the elastic sheet 80 may be provided to have a predetermined thickness or less to reduce an overall thickness of a substrate, thereby minimizing a surface unevenness due to mechanical deformation in a three-dimensional axis direction. Specifically, as a thickness of a substrate is decreased, an actual Poisson's ratio may be decreased. Accordingly, in the stretchable substrate 100, the overall thickness of the substrate is reduced through the elastic sheet having a predetermined thickness or less, thereby minimizing mechanical deformation occurring in a three-dimensional axis direction. Accordingly, the distortion of a surface can be reduced.

Specifically, the stretchable substrate 100 may include an auxetic 20 including a plurality of unit structures, a fixing part 30 for fixing the auxetic, and one or more elastic sheets 80 bonded to one surface of the auxetic 20.

One or more elastic sheets may be formed to have a predetermined thickness or less and bonded to one surface to the auxetic, thereby controlling a strain in one axial direction in response to an external force generated in another axial direction. That is, the elastic sheet 80 may reduce the overall thickness of the substrate to minimize mechanical deformation occurring in a three-dimensional axis direction.

In addition, the stretchable substrate 100 may further include a fixing surface 40 that temporarily supports the auxetic 20. In this case, the fixing surface 40 may be separated after a process of forming the auxetic 20. That is, the fixing surface 40 may refer to a separate support that temporarily supports the auxetic 20 in the process of forming the auxetic 20.

In an additional embodiment, the stretchable substrate 100 may further include a substrate part made of an elastic material. In this case, the auxetic 20 may be formed on a substrate part 10.

In addition, the stretchable substrate 100 may further include an adhesive or an elastic liquid for bonding one or more elastic sheets 80 to one surface of the auxetic 20. That is, one surface of the auxetic 20 and one or more elastic sheets may be bonded through the adhesive or the elastic liquid. According to one embodiment, when one or more elastic sheets 80 and the auxetic 20 are bonded through the elastic liquid, curing may be separately performed such that the bonding is achieved through the elastic liquid.

Figure 14:
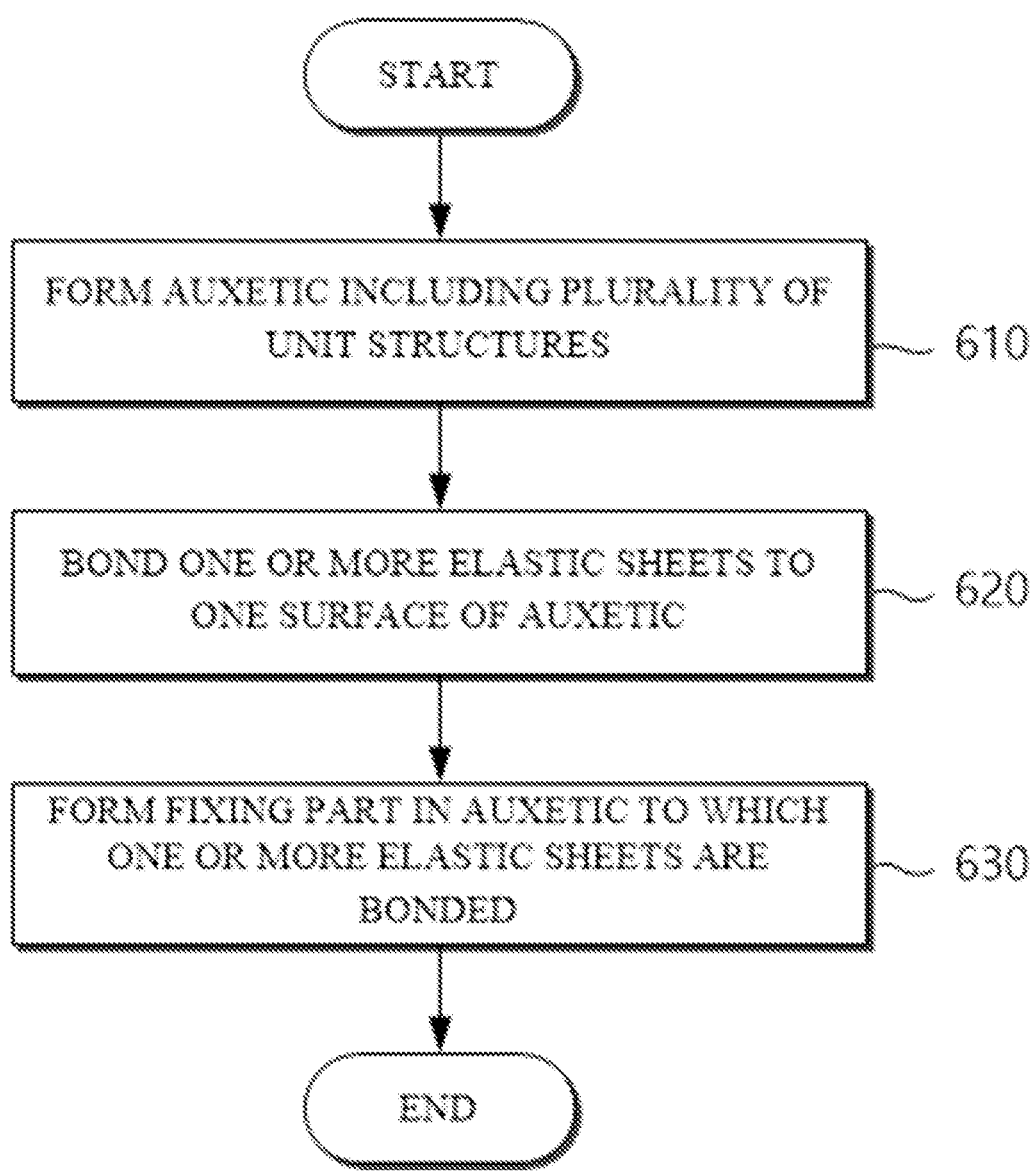
FIG. 14 is an exemplary flowchart illustrating a method of manufacturing a stretchable substrate including one or more elastic sheets according to an exemplary embodiment of the present disclosure.

The stretchable substrate 100 including one or more elastic sheets 80 as described above may be manufactured through operations shown in FIG. 14. FIG. 14 is an exemplary flowchart illustrating a method of manufacturing a stretchable substrate including one or more elastic sheets according to an exemplary embodiment of the present disclosure. According to one embodiment, the method of manufacturing a stretchable substrate may include the following operations. A sequence of the operations shown in FIG. 14 may be changed as needed, and one or more operations may be omitted or added. That is, the above-described operations are merely one embodiment of the present disclosure, and the scope of the present disclosure is not limited thereto. The contents described with reference to FIGS. 1 to 12 are referenced for the features that overlap the features described above with reference to FIGS. 1 to 12 among the features of the contents shown in FIG. 14, and descriptions thereof will be omitted here.

According to one embodiment of the present disclosure, the method of manufacturing a stretchable substrate including elastic sheets may include operation 610 of forming an auxetic including a plurality of unit structures, operation 620 of bonding one or more elastic sheets to one surface of the auxetic, and operation 630 of forming a fixing part in the auxetic to which one or more elastic sheets are bonded.

Specifically, operation 610 of forming the auxetic may include forming the auxetic on a fixing surface, forming the fixing part, performing curing, and separating the fixing surface. Here, the fixing surface 40 may be provided to temporarily support the auxetic in a process of forming the auxetic 20 and may be separated from the auxetic 20 after the process of forming the auxetic.

The process of forming the auxetic 20 on one side of the fixing surface 40 may be performed, and after the process of forming the auxetic 20, a fixing part 30 in a liquid state may be supplied. After the supply of the fixing part 30 in a liquid state, first curing for coupling the fixing part 30 and an auxetic 20 may be performed. In addition, after the first curing is performed, second curing for improving a mechanical strength of the auxetic 20 may be performed. After the second curing, the fixing surface 40 may be separated to form the auxetic 20 including the fixing part 30 in each of the plurality of unit structures.

In addition, operation 620 of bonding one or more elastic sheets to one surface of the auxetic may include applying an adhesive or an elastic liquid to the auxetic and attaching one or more elastic sheets to the auxetic. In this case, the bonding of one or more elastic sheets to one surface of the auxetic may further include performing curing. For example, when one or more elastic sheets 80 and the auxetic 20 are bonded through the elastic liquid, curing may be separately performed such that the bonding (or coupling) is achieved through the elastic liquid.

Figure 13:
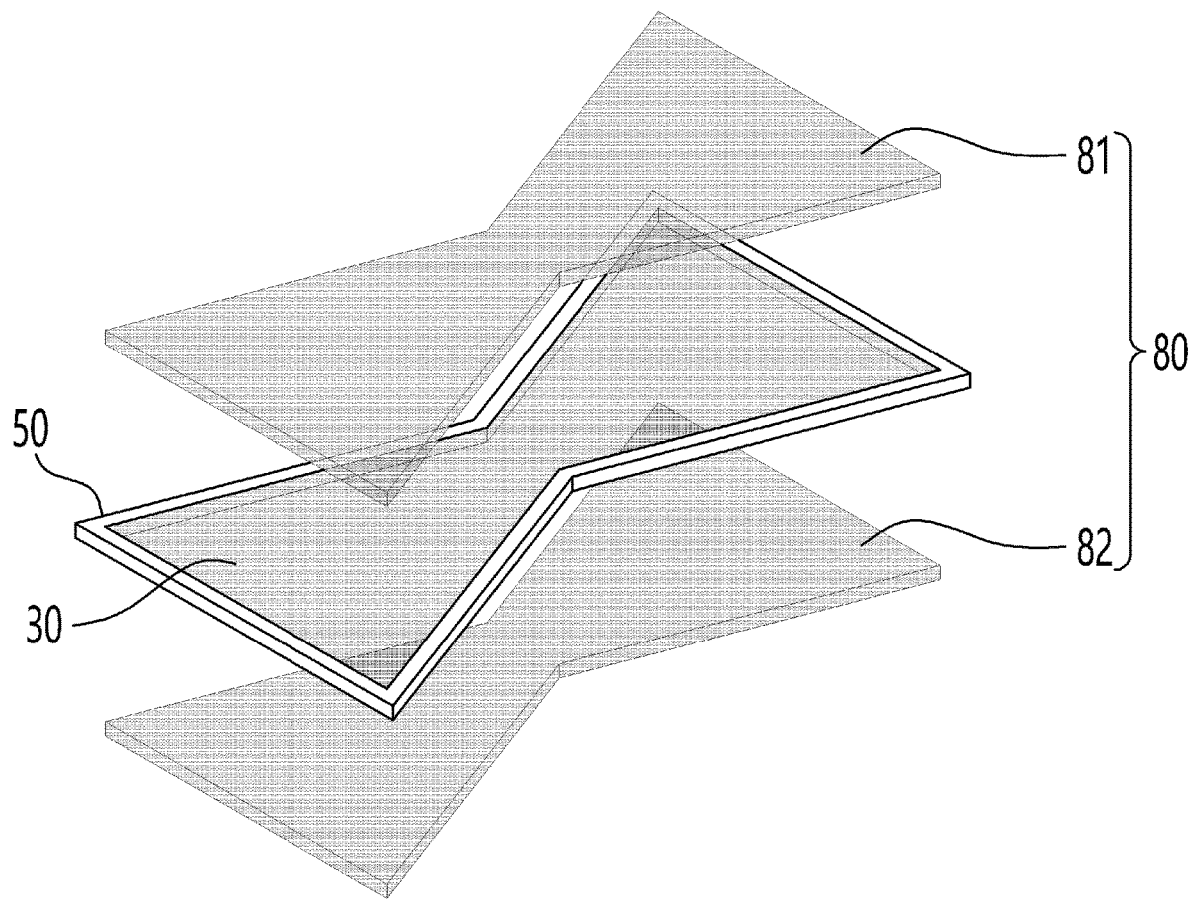
FIG. 13 is an exemplary diagram for describing one or more elastic sheets according to an embodiment of the present disclosure.

According to one embodiment of the present disclosure, one or more elastic sheets may be attached to both surfaces of the auxetic. For example, as shown in FIG. 13, one or more elastic sheets 80 may include a first elastic sheet 81 and a second elastic sheet 82, and each elastic sheet may be attached to each of an upper and a lower surface of the auxetic.

In this case, sine the elastic sheets are formed on both surfaces of the auxetic 20, the auxetic may be encapsulated. Thus, it is possible to improve the sustainability of effects of preventing surface distortion of the stretchable substrate 100 and preventing damage to elements. In other words, it is possible to improve the operation efficiency of the stretchable substrate 100.

The stretchable substrate 100 including one or more elastic sheets may be manufactured through the above-described manufacturing operations. That is, the stretchable substrate 100 of the present disclosure may be manufactured through a process of providing a plurality of auxetics (that is, including the fixing part 30 in each of the plurality of unit structures) and a plurality of elastic sheets and bonding one or more elastic sheets to each auxetic. Such a process can provide high process efficiency, such as providing manufacturing convenience in terms of mass production. In addition, in the stretchable substrate including one or more elastic sheets, an overall thickness of the substrate is reduced through the elastic sheet having a predetermined thickness or less, thereby minimizing mechanical deformation occurring in a three-dimensional axis direction. Accordingly, it is possible to provide effects of preventing the occurrence of an unevenness phenomenon of a surface layer and preventing damage to elements.

According to one embodiment of the present disclosure, a stretchable substrate 100 may be implemented through an auxetic including an inner elastic body 90. The stretchable substrate 100 including the inner elastic body will be described in detail below with reference to FIGS. 15 and 16.

Figure 15:
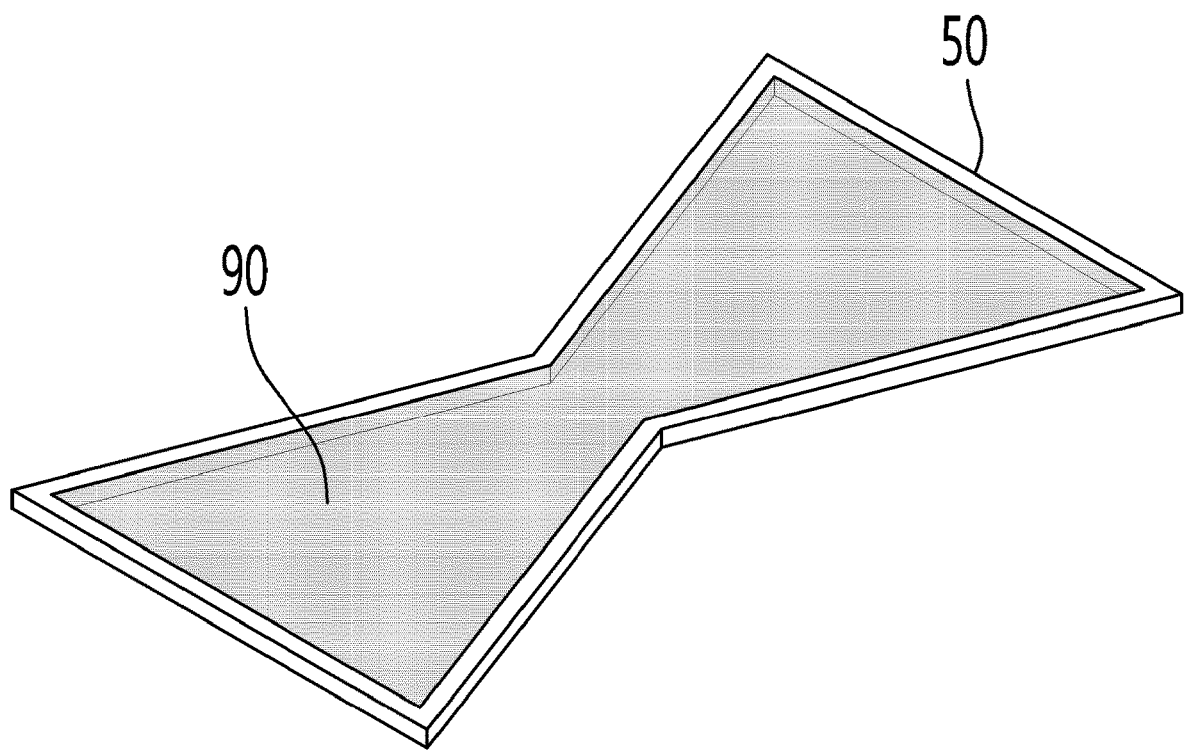
FIG. 15 is an exemplary diagram for describing an inner elastic body according to an embodiment of the present disclosure.

In the present disclosure, the inner elastic body 90 is made of an elastic material having a negative Poisson's ratio and fills at least some of a plurality of unit structures, thereby minimizing a surface unevenness due to mechanical deformation in a three-dimensional axis direction. Specifically, the stretchable substrate 100 may include the inner elastic body 90 having a Poisson's ratio close to zero in each of the plurality of unit structures. For example, as shown in FIG. 15, an inner filler may fill the unit structure in an inner direction thereof and may be stretched in response to contraction in a three-dimensional axis direction, thereby supporting a surface. For example, when stretching in a two-dimensional axis direction occurs in a corresponding substrate, the inner elastic body 90 filling at least some of the plurality of unit structures may swell in a three-dimensional axis direction to support a contracted surface. That is, the inner elastic body, which is made of a mechanical metamaterial having a negative Poisson's ratio, is provided in each unit structure 50, thereby preventing an unevenness of a surface caused when a contractile force acts in a three-dimensional direction.

Specifically, the stretchable substrate 100 may include an auxetic 20 including the plurality of unit structures and the inner elastic body 90 filling each of the plurality of unit structures.

The inner elastic body 90 is made of an elastic material having a negative Poisson's ratio and fills at least some of the plurality of unit structures, thereby minimizing a surface unevenness due to mechanical deformation in a three-dimensional axis direction. For example, the inner elastic body 90 may have a Poisson's ratio close to zero and may be stretched in one axial direction in response to an external force generated in another axial direction.

In addition, the stretchable substrate 100 may further include a fixing surface 40 that temporarily supports the auxetic 20. In this case, the fixing surface 40 may be separated after a process of forming the auxetic 20. That is, the fixing surface 40 may refer to a separate support that temporarily supports the auxetic 20 in the process of forming the auxetic 20.

In an additional embodiment, the stretchable substrate 100 may further include a substrate part made of an elastic material. In this case, the auxetic 20 may be formed on a substrate part 10.

Figure 16:
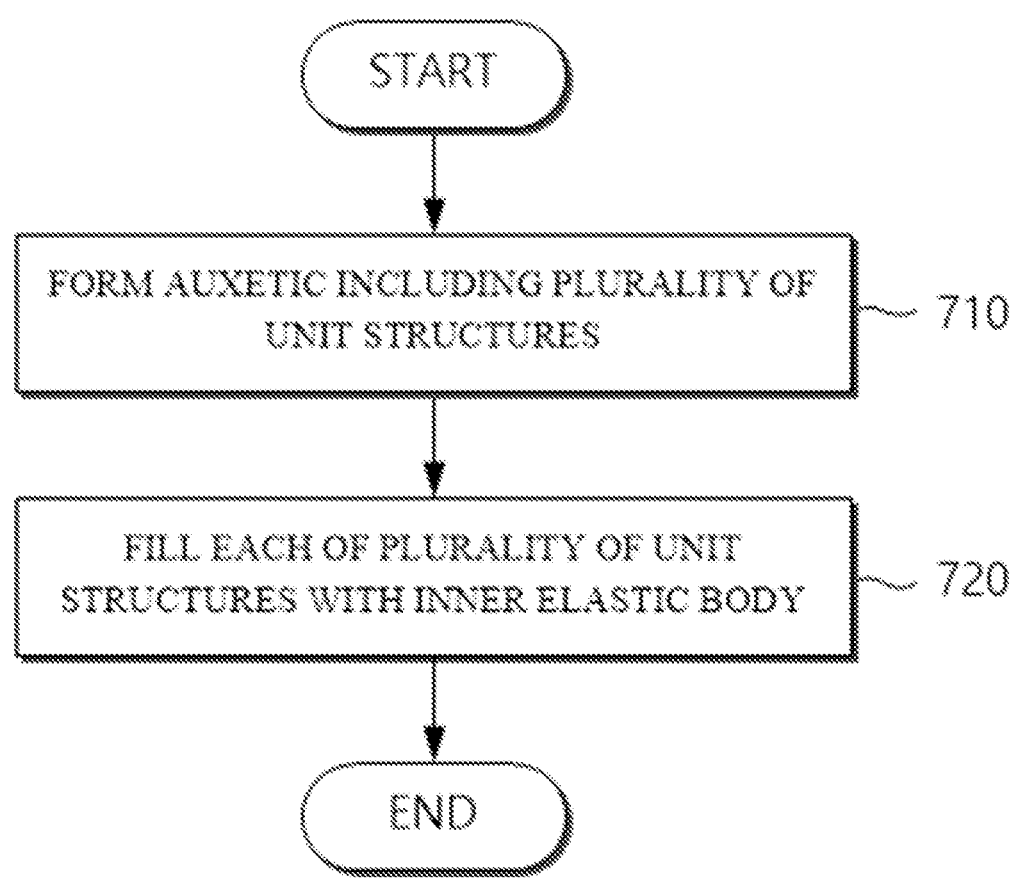
FIG. 16 is an exemplary flowchart illustrating a method of manufacturing a stretchable substrate including an inner elastic body according to an exemplary embodiment of the present disclosure.

The stretchable substrate including the inner elastic body as described above may be manufactured through operations shown in FIG. 16. FIG. 16 is an exemplary flowchart illustrating a method of manufacturing a stretchable substrate including an inner elastic body according to an exemplary embodiment of the present disclosure. According to one embodiment, the method of manufacturing a stretchable substrate may include the following operations. A sequence of the operations shown in FIG. 16 may be changed as needed, and one or more operations may be omitted or added. That is, the above-described operations are merely one embodiment of the present disclosure, and the scope of the present disclosure is not limited thereto. The contents described with reference to FIGS. 1 and 15 are referenced for the features that overlap the features described above with reference to FIGS. 1 and 15 among the features of the contents shown in FIG. 16, and descriptions thereof will be omitted here.

According to one embodiment of the present disclosure, a method of manufacturing a stretchable substrate including an inner elastic body 90 may include operation 710 of forming an auxetic including a plurality of unit structures and operation 720 of filling each of the plurality of unit structures with an inner elastic body.

According to one embodiment of the present disclosure, operation 710 of forming an auxetic 20 may include forming the auxetic including the plurality of unit structures on a fixing surface 40 and filling each of the plurality of unit structures with the inner elastic body.

Specifically, a process of forming the auxetic 20 on one side of the fixing surface 40 may be performed, and after the process of forming the auxetic 20, each of the plurality of unit structures may be filled with the inner elastic body 90. After the filling of each of the plurality of unit structures with the inner elastic body 90, first curing for coupling the inner elastic body 90 and the auxetic 20 may be performed. In addition, after the first curing is performed, second curing for improving a mechanical strength of the auxetic 20 may be performed. After the second curing, the fixing surface 40 may be separated to form the auxetic 20 including the inner elastic body 90 in each of the plurality of unit structures.

According to another embodiment of the present disclosure, operation 710 of forming the auxetic 20 may include forming a substrate part 10, forming the auxetic including the plurality of unit structures on the substrate part 10, and filling in each of the plurality of unit structures with the inner elastic body.

The stretchable substrate 100 including the inner elastic body 90 may be manufactured through the above-described manufacturing operations. That is, in the stretchable substrate 100, the inner elastic body 90 is provided in at least some of the plurality of unit structures, thereby minimizing a surface unevenness due to mechanical deformation in a three-dimensional axis direction. In other words, since the inner elastic body, which is made of a mechanical metamaterial having a negative Poisson's ratio, is provided in each unit structure 50, when a contractile force acts in a three-dimensional direction, a surface is supported by the inner elastic body, thereby preventing an unevenness of the surface.

According to various embodiments of the present disclosure, the present disclosure can provide a stretchable substrate that is freely usable by being deformed in a multidimensional axis direction under various conditions. In addition, it is possible to provide a stretchable substrate having a high transmittance as well as a stable mechanical strain. Furthermore, it is possible to reduce screen distortion by controlling a strain occurring in a direction perpendicular to a stretching direction when stretching occurs in one axial direction.

Effects of the present disclosure may not be limited to the above-described ones, and the other unmentioned effects of the present disclosure will become apparent to those skilled in the art from the above description.

Although the embodiments of the present disclosure have been described with reference to the accompanying drawings, it should be understood that those skilled in the art can carry out other modifications without changing the technical spirit or essential features of the present disclosure. Therefore, it should be understood that the embodiments described herein are illustrative and not restrictive in all aspects.

Particular implementations described in the present disclosure are exemplary and do not limit the scope of practiced embodiments. For conciseness of the specification, the description of conventional electronic configurations, control systems, software, and other functional aspects of systems may be omitted. Moreover, connections of lines or connecting elements between components shown in the accompanying drawings may represent functional connections and/or physical or circuit connections and may represent various kinds of replaceable or additional functional connections, physical connections, or circuit connections in an actual device. Furthermore, when not specifically described using terms such as "essentially" or "importantly," elements described in the specification may not be necessarily required for application of the present disclosure.

It will be appreciated that a specific order or a hierarchical structure of steps in the presented processes and methods is one example of exemplary approaches. It will be appreciated that the specific order or the hierarchical structure of the steps in the processes within the scope of the present disclosure may be rearranged based on design priorities. Appended method claims provide elements of various steps in a sample order, but this does not mean that the method claims are limited to the presented specific order or hierarchical structure.

The description of the presented embodiments is provided so that those skilled in the art of the present disclosure may use or implement the present disclosure. Various modifications of the embodiments will be apparent to those skilled in the art of the present disclosure, and general principles defined herein can be applied to other embodiments without departing from the scope of the present disclosure. Therefore, the present disclosure is not limited to the embodiments presented herein but should be interpreted within the widest range which is associated with the principles and new features presented herein.

What is claimed is:

1. A method of manufacturing a stretchable substrate, the method comprising:
   forming an auxetic on a fixing surface, wherein the auxetic comprises a plurality of unit structures and a plurality of microstructures, wherein: the plurality of unit structures have the same reentrant shape; the plurality of microstructures comprise first microstructures, which are protruded from inner surfaces of a respective unit structure of the plurality of unit structures; each first microstructure has a hemispherical shape; the plurality of microstructures comprise second microstructures; each second microstructure comprises a first triangle plate and a second triangle plate; a first vertex of the first triangle plate and a first vertex of the second triangle are facing each other at a distance; a second vertex and a third vertex of the first triangle are in contact with a first end surface inside the respective unit structure of the plurality of unit structures; and a second vertex and a third vertex of the second triangle are in contact with a second end surface inside the respective unit structure of the plurality of unit structures;
   forming a substrate part on the fixing surface; and
   separating the fixing surface from the plurality of microstructures and the substrate part.

2. The method of claim 1, wherein the substrate part is made of an elastic material.

3. The method of claim 1, wherein the forming of the auxetic comprises: treating the fixing surface with a release preventing agent, wherein the release preventing agent is applied, printed, or sprayed.

4. The method of claim 1, further comprises:
   forming a fixing part on the substrate part.

5. The method of claim 1, wherein the forming of the auxetic comprises:
   forming the auxetic including a porous pattern, wherein the porous pattern is formed to include one or more holes including an inner space layer.

* * * * *